US008502300B2

(12) United States Patent
Fukuda et al.

(10) Patent No.: US 8,502,300 B2
(45) Date of Patent: Aug. 6, 2013

(54) NON-VOLATILE SEMICONDUCTOR MEMORY DEVICE

(75) Inventors: Ryo Fukuda, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 13/232,492

(22) Filed: Sep. 14, 2011

(65) Prior Publication Data

US 2012/0068256 A1    Mar. 22, 2012

(30) Foreign Application Priority Data

Sep. 22, 2010   (JP) ................................. 2010-212479

(51) Int. Cl.
*H01L 29/792*    (2006.01)

(52) U.S. Cl.
USPC ............. 257/324; 257/E21.423; 257/E29.309

(58) Field of Classification Search
None
See application file for complete search history.

(56) References Cited

U.S. PATENT DOCUMENTS

| | | | | |
|---|---|---|---|---|
| 6,434,053 | B1 * | 8/2002 | Fujiwara .................. | 365/185.28 |
| 8,335,111 | B2 * | 12/2012 | Fukuzumi et al. ....... | 365/185.18 |
| 2007/0252201 | A1 | 11/2007 | Kito et al. | |

OTHER PUBLICATIONS

Wonjoo Kim, et al., "Multi-Layered Vertical Gate NAND Flash Overcoming Stacking Limit for Terabit Density Storage", Symposium on VLSI Technology Digest of Technical Papers, 2009, pp. 188-189.

A. Hubert, et al., "A stacked SONOS technology, up to 4 levels and 6nm crystalline nanowires, with gate-all-around or independent gates (Φ-Flash), suitable for full 3D integration", IEEE, 2009, 4 pages.

Erh-Kun Lai, et al., "A Multi-Layer Stackable Thin-Film Transistor (TFT) NAND-Type Flash Memory", IEEE, 2009, 4 pages.

Erh-Kun Lai, et al., "A Highly Stackable Thin-Film Transistor (TFT) NAND-Type Flash Memory", IEEE, 2006 Symposium on VLSI Technology Digest of Technical Papers, 2 pages.

Soon-Moon Jung, et al., "Three Dimensionally Stacked NAND Flash Memory Technology Using Stacking Single Crystal Si Layers on ILD and TANOS Structure for Beyond 30nm Node", IEEE, 2006, 4 pages.

Atsushi Nozoe, et al., "A 3.3V High-Density and Flash Memory with 1ms/512B Erase & Program Time", Solid-State Circuits Conference Digest of Technical Papers, 1995, pp. 124-125.

Hitoshi Miwa, et al., "A 140mm$^2$ 64Mb and Flash Memory with a 0.4 μm Technology", ISSCC Digest of Technical Papers, Feb. 1996, pp. 34-35.

Shin-ichi Kobayashi, et al., A 3.3v-Only 16 Mb DINOR Flash Memory, ISSCC Digest of Technical Papers, Feb. 1995, pp. 122-123.

\* cited by examiner

*Primary Examiner* — Thien F Tran
(74) *Attorney, Agent, or Firm* — Oblon, Spivak, McClelland, Maier & Neustadt, L.L.P.

(57) ABSTRACT

An dielectric film is formed above the semiconductor substrate. A first conductive layer is formed in the dielectric film and extending in a first direction. The first conductive layer is connected to a first select transistor. A second conductive layer formed in the dielectric film and extending in the first direction. The second conductive layer is connected to a second select transistor. A semiconductor layer is connected to both the first and second conductive layers and functioning as a channel layer of a memory transistor. A gate-insulating film is formed on the semiconductor layer. The gate-insulating film includes a charge accumulation film as a portion thereof. A third conductive layer is surrounded by the gate-insulating film.

14 Claims, 29 Drawing Sheets

NON-VOLATILE SEMICONDUCTOR MEMORY DEVICE

CROSS REFERENCE TO RELATED APPLICATIONS

This application is based on and claims the benefit of priority from prior Japanese Patent Application No. 2010-212479, filed on Sep. 22, 2010, the entire contents of which are incorporated herein by reference.

FIELD

The embodiments described in the present specification relate to a non-volatile semiconductor memory device.

BACKGROUND

To improve the bit density of a non-volatile semiconductor memory device such as a NAND flash memory, lamination of memory cells has recently drawn attention because the miniaturization technology is approaching its limit. One proposed technology is a stacked NAND flash memory including a vertical transistor in the memory cell. The stacked NAND flash memory includes a memory string and select transistors provided at both ends of the memory string. The memory string includes a plurality of memory cells connected in series in the laminate direction.

In the stacked NAND flash memory, with the increase of the memory density due to the advance of miniaturization and with the increase of the number of memory transistors connected in series in one memory string, less current flows during the read operation, thus increasing the possibility of misreading.

DETAILED DESCRIPTION

Figure 1:
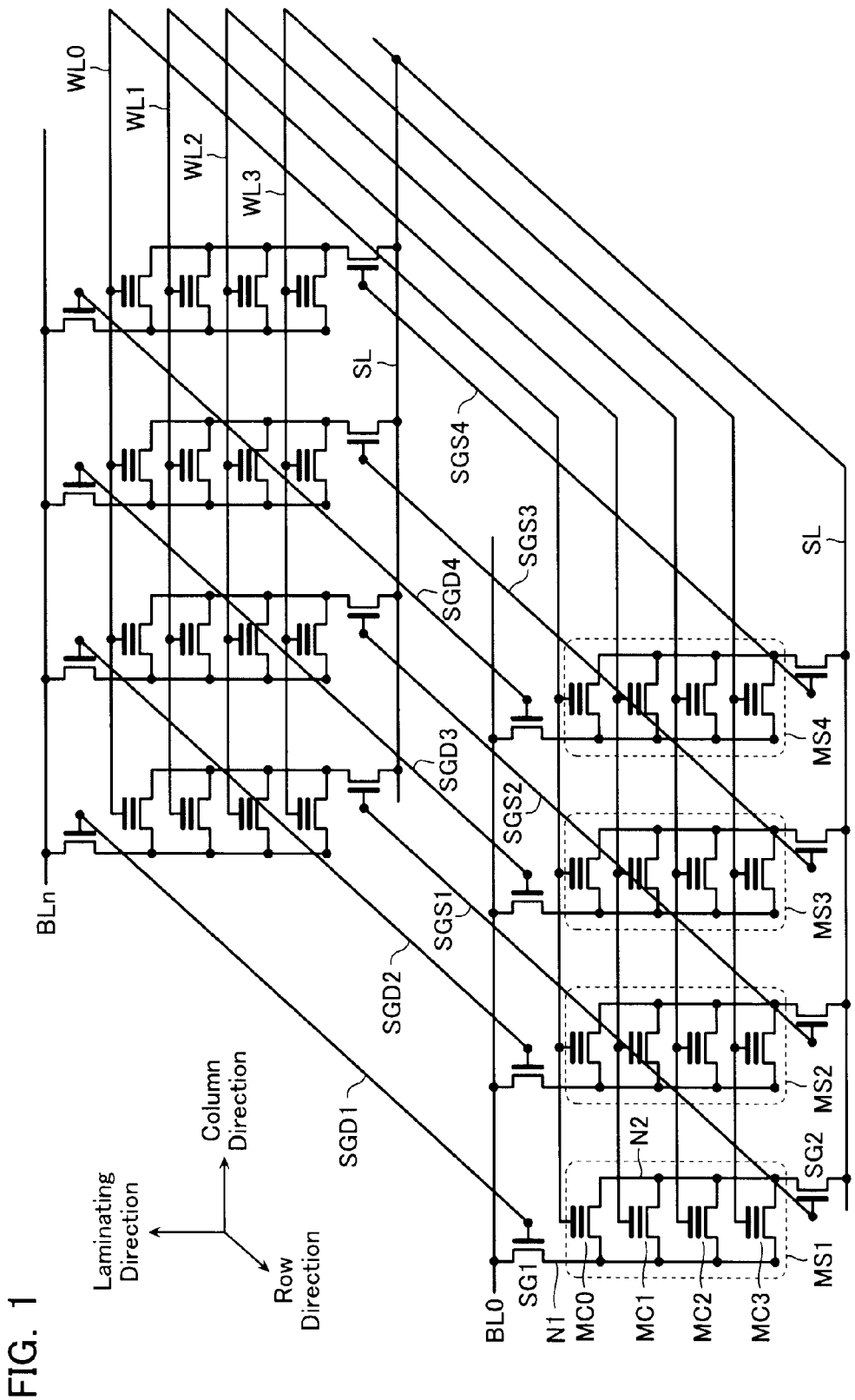
FIG. 1 is an equivalent circuit diagram showing a structure of a memory cell array of a non-volatile semiconductor memory device according to a first embodiment.

A non-volatile semiconductor memory device according to the embodiments described below includes a dielectric film formed above the semiconductor substrate. A first conductive layer is formed in the dielectric film and extending in a first direction. The first conductive layer is connected to a first select transistor. A second conductive layer formed in the dielectric film and extending in the first direction. The second conductive layer is connected to a second select transistor. A semiconductor layer is connected to both the first and second conductive layers and functioning as a channel layer of a memory transistor. A gate-insulating film is formed on the semiconductor layer. The gate-insulating film includes a charge accumulation film as a portion thereof. A third conductive layer is surrounded by the gate-insulating film.

Referring now to the drawings, the embodiments of a non-volatile semiconductor memory device according to the present invention will be described below.

(First Embodiment)

Referring first to FIG. 1, the configuration of a non-volatile semiconductor memory device according to a first embodiment will be described.

[Structure of First Embodiment]

FIG. 1 is an equivalent circuit diagram of a memory cell array of a non-volatile semiconductor memory device according to the first embodiment. With reference to FIG. 1, a non-volatile semiconductor memory device according to this embodiment includes a plurality of memory sub-blocks MS (MS1, MS2, . . . ) arranged in a matrix on a semiconductor substrate not shown in FIG. 1. Note that FIG. 1 illustrates one memory block in which the same word-lines WL are shared. Although not shown in FIG. 1, a different memory block is formed in the extensions of bit-lines BL, the memory block being connected to different word-lines WL0' to WL3'.

One memory block includes 4×n memory sub-blocks MS disposed in a matrix. A plurality of bit-lines BL (n lines in FIG. 1) each have a longitudinal direction in the column direction. The bit-lines BL are arranged at a predetermined pitch in the row direction perpendicular to the column direction. A plurality of first select-gate-lines SGD (4 lines in FIG. 1) and second select-gate-lines SGS (4 lines in FIG. 1) each have a longitudinal direction in the row direction, and are arranged at a predetermined pitch in the column direction. Each of the plurality of word-lines WL (4 lines in FIG. 1) is provided to be commonly connected to the gates of a plurality of memory transistors MC (4×n in FIG. 1) present in the same layer. 4×n memory sub-blocks MS commonly connected to one word-line WL forms one memory block.

One memory sub-block MS includes a plurality of memory transistors MC0 to MC3 (4 transistors in FIG. 1) connected in parallel between a first node N1 and a second node N2. Between the first end (the first node N1) of the memory sub-block MS and the bit-line BL, a first select transistor SG1 is connected. Between the second end (the second node N2) of the memory sub-block MS and the source-line SL, a second select transistor SG2 is connected. These select transistors SG1 and SG2 are rendered conductive to select the memory sub-block MS.

The memory sub-block MS is formed by laminating the 4 memory transistors MC0 to MC3 in the laminate direction perpendicular to the semiconductor substrate (not shown in FIG. 1), as described below. The memory transistors MCi (i=0 to 3) in the memory sub-blocks MS arranged in a matrix are connected to the same word-line WLi.

Figure 2:
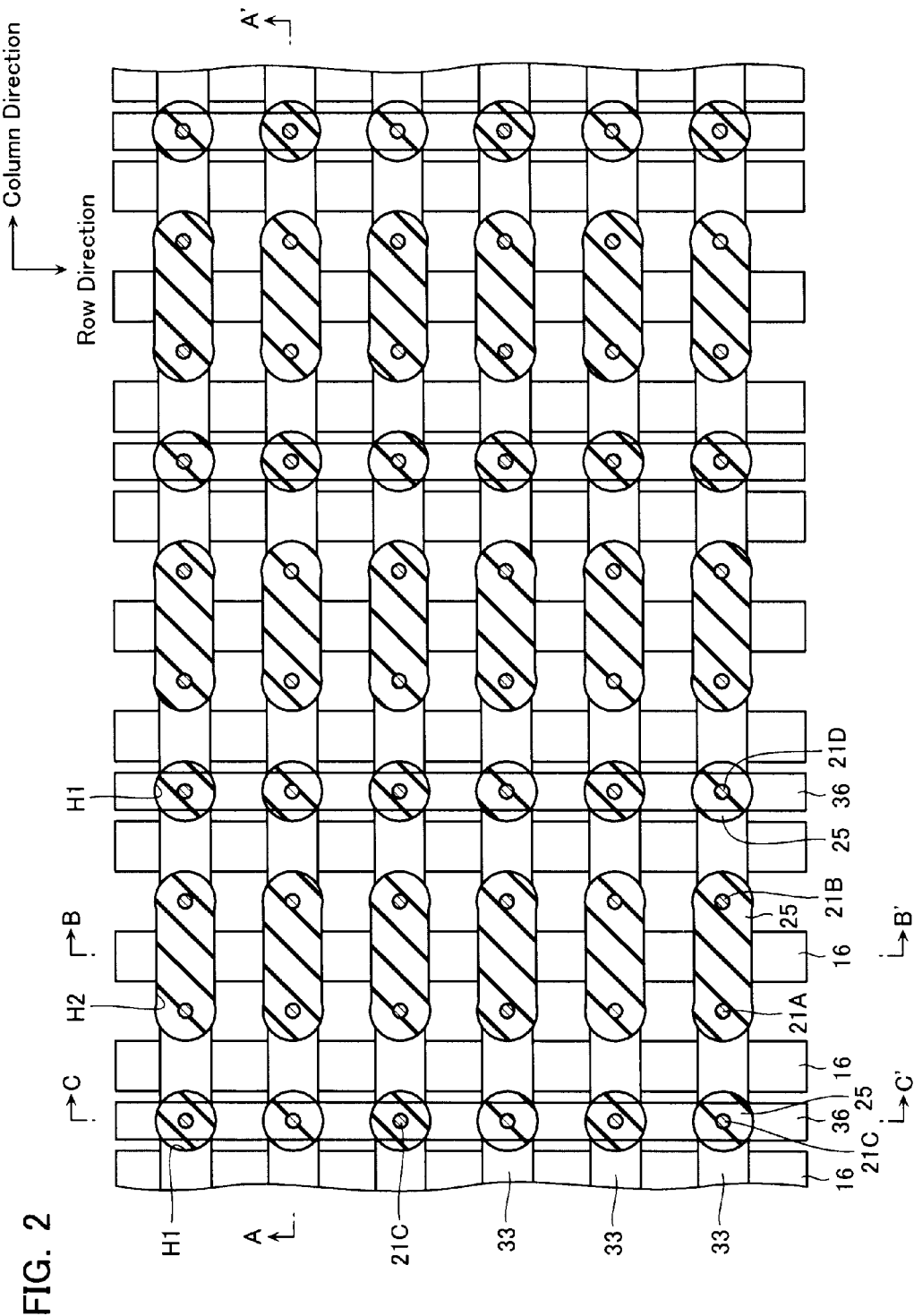
FIG. 2 is a plan view showing a structure of a memory cell array portion of a non-volatile semiconductor memory device according to the first embodiment.
Figure 3:
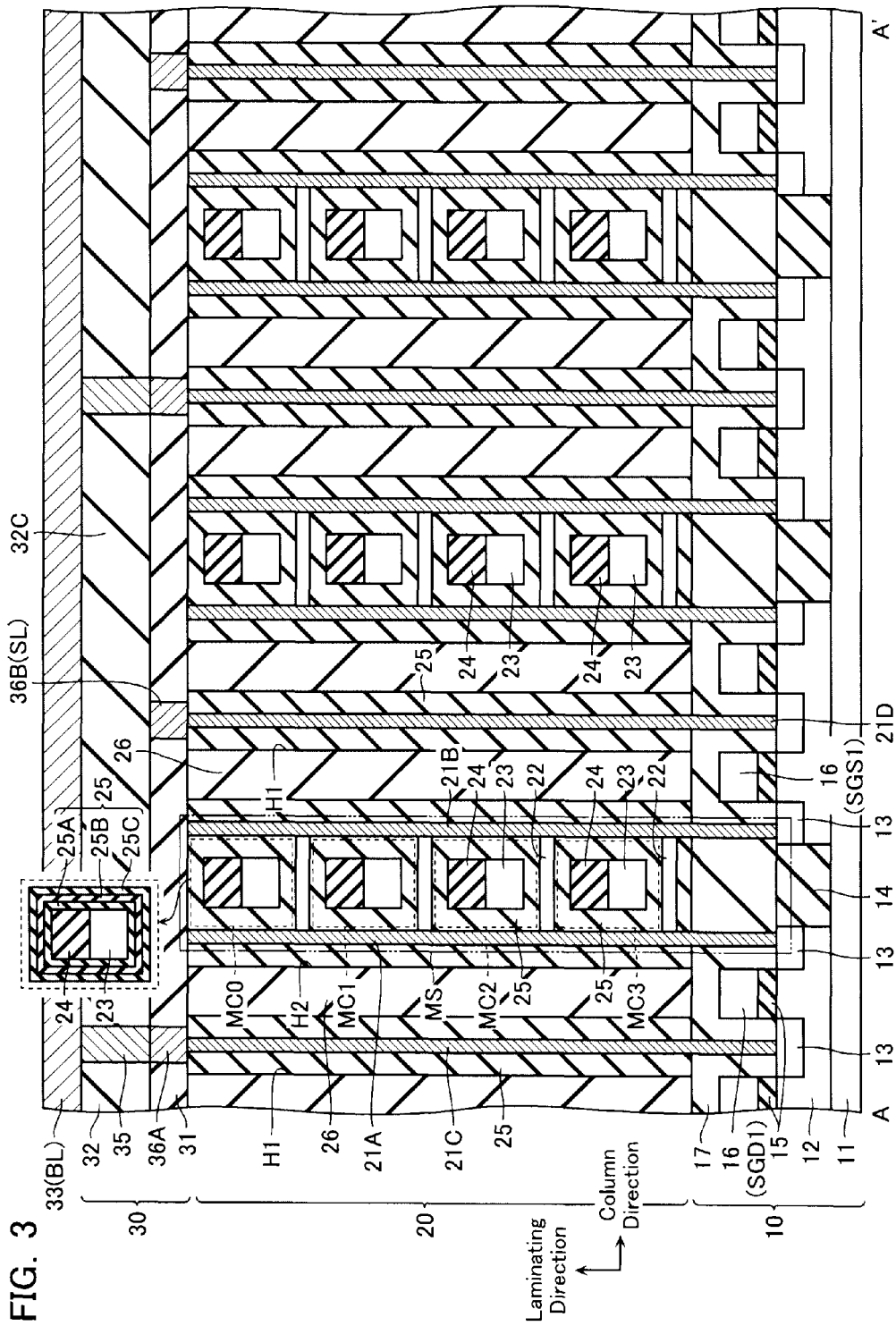
FIG. 3 is the A-A' cross-sectional view in FIG. 2.
Figure 4:
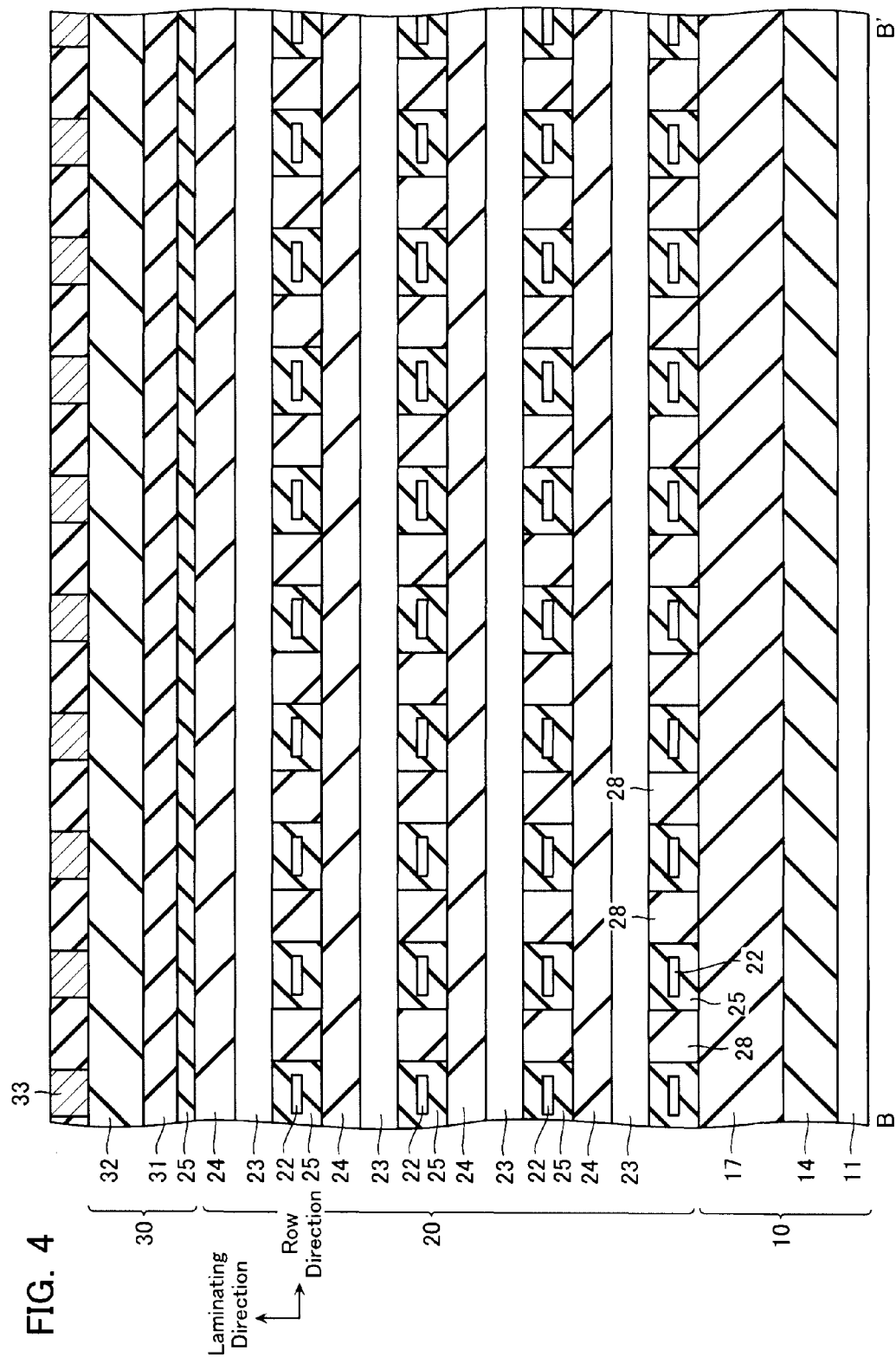
FIG. 4 is the B-B' cross-sectional view in FIG. 2.
Figure 5:
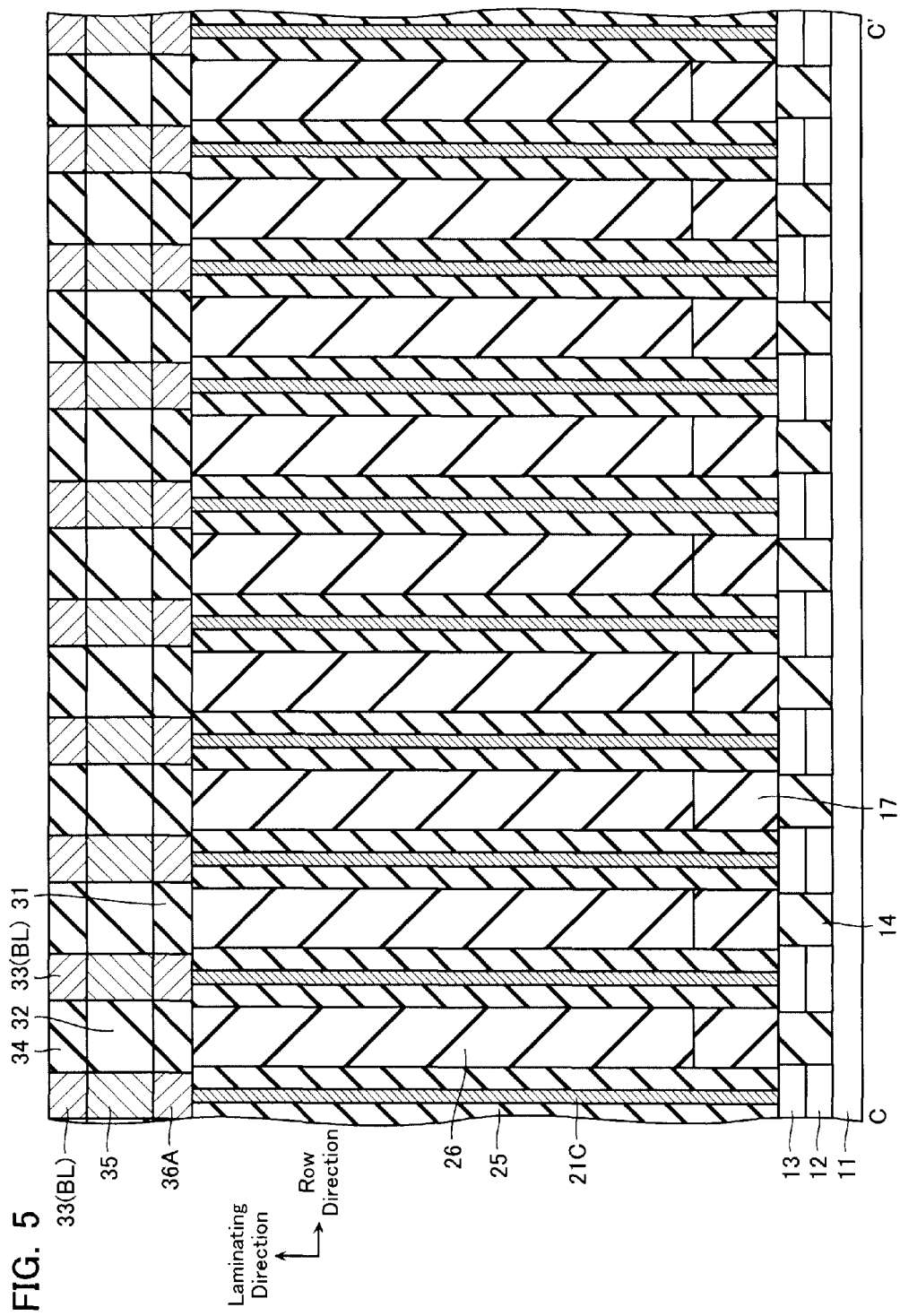
FIG. 5 is the C-C' cross-sectional view in FIG. 2.

Referring now to FIG. 2 to FIG. 5, an actual structure of the memory cell array will be described. FIG. 2 is a plan view of the memory cell array portion. FIG. 3, FIG. 4, and FIG. 5 are the A-A' cross-sectional view, the B-B' cross-sectional view, and the C-C' cross-sectional view in FIG. 2, respectively. Note that FIG. 2 is shown with less important members removed, such as an interlayer dielectric film.

With reference to FIG. 3, the memory cell array includes a semiconductor substrate 11 that bears a select transistor layer 10, a memory layer 20, and an interconnection layer 30 in this order.

The select transistor layer 10 includes a plurality of p-type well layers 12 formed on the semiconductor substrate 11. The p-type well 12 is a well region in which the first select transistor SG1 and the second select transistor SG2 are formed. In one p-type well 12, two first select transistors SG1 are formed or two second select transistor SG2 are formed. The p-type wells 12 are provided on the semiconductor substrate 11 in a matrix. Each of the p-type well layers 12 has a surface in which an n-type diffusion layer 13 is formed that functions as the source/drain diffusion layers of the first and second select transistors SG1 and SG2. The p-type well layers 12 are insulation-isolated to each other by element isolation insulating films 14.

On the surface of the p-type well 12 between two n-type diffusion layers 13, a gate-insulating film 15 and a gate electrode film 16 are formed in this order. The gate electrode film 16 functions as the gate electrode of the first select transistor SG1 or the second select transistor SG2. The gate electrode film 16 is covered by an interlayer dielectric film 17. The gate-insulating film 15 includes, for example, a silicon oxide film (SiO2). The gate electrode film 16 is formed of, for example, polysilicon. The interlayer dielectric film 17 includes, for example, a silicon oxide film (SiO2).

The memory layer 20 includes an interlayer dielectric film 26 formed on the interlayer dielectric film 17. In the interlayer dielectric film 26, through-holes H1 and H2 are formed in a matrix when seen in plan view, as shown in FIG. 2. The through-hole H2 has an oval shape having a longitudinal direction in the column direction. Inside the through-hole H2, members for forming the memory sub-block MS are formed. The memory sub-block MS includes a first conductive layer 21A, a second conductive layer 21B, a semiconductor layer 22, a gate electrode film 23, a silicon oxide film 24, and an ONO film 25.

The first conductive layer 21A and the second conductive layer 21B are formed within the through-holes H2 formed in the interlayer dielectric film 26. The layers 21A and 21B each have a longitudinal direction in the laminate direction perpendicular to the semiconductor substrate 11. The layers 21A and 21B are formed extending to the underlying n-type diffusion layer 13. The first conductive layer 21A and the second conductive layer 21B are formed of, for example, tungsten (W). A third conductive layer 21C connects a conductive layer 33 forming the bit-lines BL with the n-type diffusion layer 13. A fourth interconnection layer 21D connects a conductive layer 36 forming the source-lines SL with the n-type diffusion layer 13. The third conductive layer 21C and the fourth interconnection layer 21D are formed within the through-holes H1 and pass through the ONO film 25.

The third conductive layer 21C and the fourth interconnection layer 21D as well as the first conductive layer 21A and the second conductive layer 21B are alternately arranged in the column direction. FIG. 5 is a cross-sectional view of the third interconnection layer 21C portion. In FIG. 5, the third interconnection layers 21C are arranged at a predetermined pitch in the row direction for each memory sub-block MS. The other interconnection layers 21A, 21B, and 21D are also arranged at the same pitch in the row direction.

The semiconductor layer 22 is formed extending in the column direction to connect a pair of the first conductive layer 21A and the second conductive layer 21B. The semiconductor layer 22 is formed of, for example, silicon. The layer 22 functions as the channel layer of the memory transistor MC, as described below. The semiconductor layers 22 are provided corresponding to the number of memory transistors MC connected in parallel in one memory sub-block MS. In this example, four semiconductor layers 22 are provided at regular intervals in the laminate direction. Note that the semiconductor layers 22 are also provided at a predetermined pitch in the row direction, in other words, to be divided for each memory sub-block MS, as shown in FIG. 4, and are also provided in a matrix when seen in plan view.

With reference to FIG. 4, each gate electrode film 23 has a longitudinal direction in the row direction and is formed over the semiconductor layers 22 arranged in the row direction. The gate electrode film 23 functions as a control gate of the memory transistor MC and the word-line WL. A predetermined number of gate electrode films 23 are provided in the laminate direction depending on the number of memory transistors MC connected in parallel in one memory sub-block MS. In this example, the number of gate electrode films 23 in the laminate direction is 4.

The gate electrode films 23 formed in the same layer are short-circuited to each other in a not-shown portion. Thus, the gates of the memory transistors MC in the same layer in the memory sub-blocks MS arranged in a matrix (for example, 4×n) on the semiconductor substrate are commonly connected to one word-line WL (one word-line WL is formed in a comb shape). The silicon oxide film 24 is formed, like the gate electrode film 23, having a longitudinal direction in the row direction.

The ONO film 25 has a 3-layer structure of a first silicon oxide film 25A (SiO2), a silicon nitride film 25B (SiN), and a second silicon oxide film 25C (SiO2). The ONO film 25 serves to allow the silicon nitride film 25B to function as a charge accumulation film, and to change the threshold voltage of the memory transistor MC based on the accumulated charge in the silicon nitride film 25B. The ONO film is formed, in the A-A' cross-section, in a closed loop shape surrounding the gate electrode film 23 and the silicon oxide film 24. The expression "in a closed loop" herein means that the ONO film wholly, almost wholly, surrounds the gate electrode film 23 and the silicon oxide film 24. The ONO films 25 is divided by the silicon nitride film 28 in the B-B' cross-section.

Thus, in other words, the memory sub-block MS has a structure in which the semiconductor layer 22, the gate electrode film 23, and the silicon oxide film 24 are alternately formed in the laminate direction to form the same 4 laminations. The gate electrode film 23 and the silicon oxide film 24 are surrounded, in the A-A' cross-section, by the ONO film 25 of a closed loop.

The structure of the interconnection layer 30 will now be described. An interlayer dielectric film 31 is formed on the top surface of the interlayer dielectric film 26. On the interlayer dielectric film 31, conductive layers 36A and 36B are formed. The conductive layer 36A provides a portion of a via contact that connects the third conductive layer 21C and the conductive layer 33, the layer 33 providing the bit-line BL. The conductive layer 36B forms the source-line SL. The layer 36B is formed connecting to the end portion of the fourth conductive layer 21D.

On the top surface of the interlayer dielectric film 31, an interlayer dielectric film 32 is formed. The interlayer dielectric film 32 includes a conductive layer 35 formed therein. The layer 35 connects the conductive layer 36A and the conductive layer 33. Further, on the interlayer conductive film 32, a different interlayer insulating layer 34 is formed. In the interlayer insulating layer 34, the conductive layer 33 providing the bit-line BL is formed. The conductive layer 33 has a longitudinal direction in the column direction. More than one layers 33 are formed at the same pitch in the row direction.

[Operation in First Embodiment]

Referring now to FIG. 6 to FIG. 11, the operation of a non-volatile semiconductor memory device having the above structure will be described.

Figure 6:
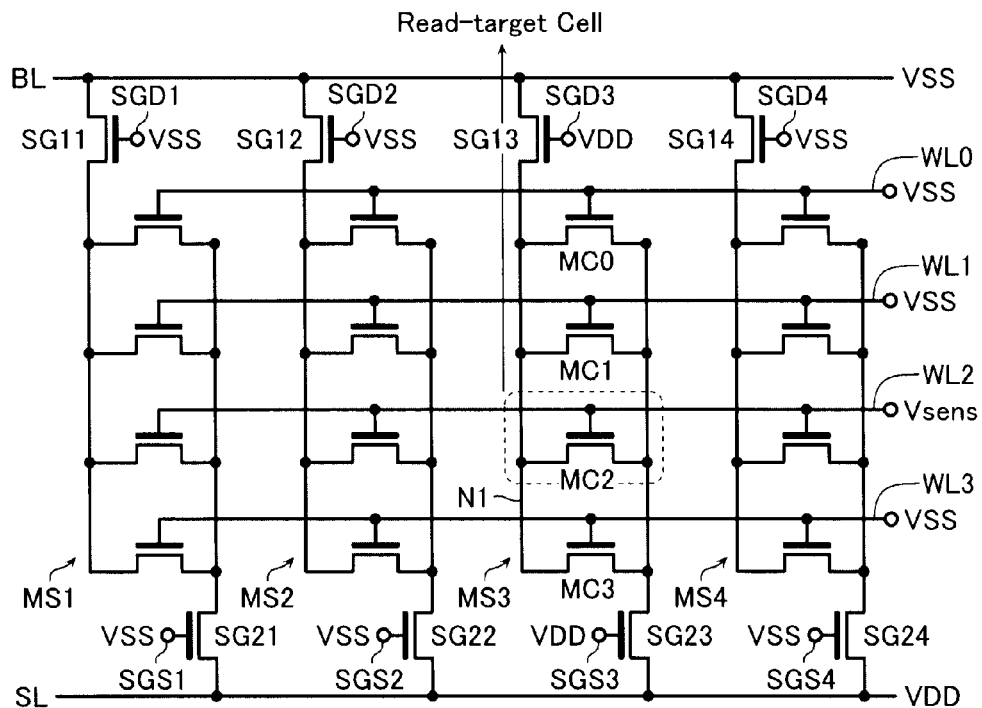
FIG. 6 illustrates the read operation of a non-volatile semiconductor memory device according to the first embodiment.

Referring first to FIG. 6, the read operation will be described. Any one of the 4 memory sub-blocks MS1 to MS4 arranged in the column direction along one bit-line BL is selected. One memory transistor MC in the selected memory sub-block MS (here, MS3) is then selected to be read. A description is given below of the operation of only one of the memory sub-blocks MS along one bit-line BL. The same holds true for the write operation and the erase operation.

With reference to FIG. 6, the memory transistor MC2 (broken line) in the memory sub-block MS3 may be selected as follows. The bit-line BL is once discharged to the ground voltage VSS. Then, with the bit-line BL left floating, the source-line SL is applied with the power supply voltage VDD, and only the select-gate-lines SGD3 and SGS3 are applied with the power supply voltage VDD, and the remaining select-gate-lines SGD1, SGD2, and SGD4, and SGS1, SGS2, and SGS4 are applied with the ground voltage VSS.

Then, only the word-line WL2 connected to the selected memory transistor MC2 is applied with a positive read voltage Vsens, while the other word-lines WL0, WL1, and WL3 are applied with the ground voltage VSS. The memory transistors MC0, MC1, and MC3 are thus rendered non-conductive. The amount of charge trapped in the charge accumulation film 25B determines the threshold voltage of the memory transistor MC2. Depending on the magnitude of the threshold voltage, it is determined that the memory transistor MC2 may be rendered conductive or not. When the memory transistor MC2 is rendered conductive allowing a current flow, the potential of the bit-line BL increases. The potential change may be sensed by a not-shown sense amplifier, thus reading data held in the memory cell MC2.

Figure 7:
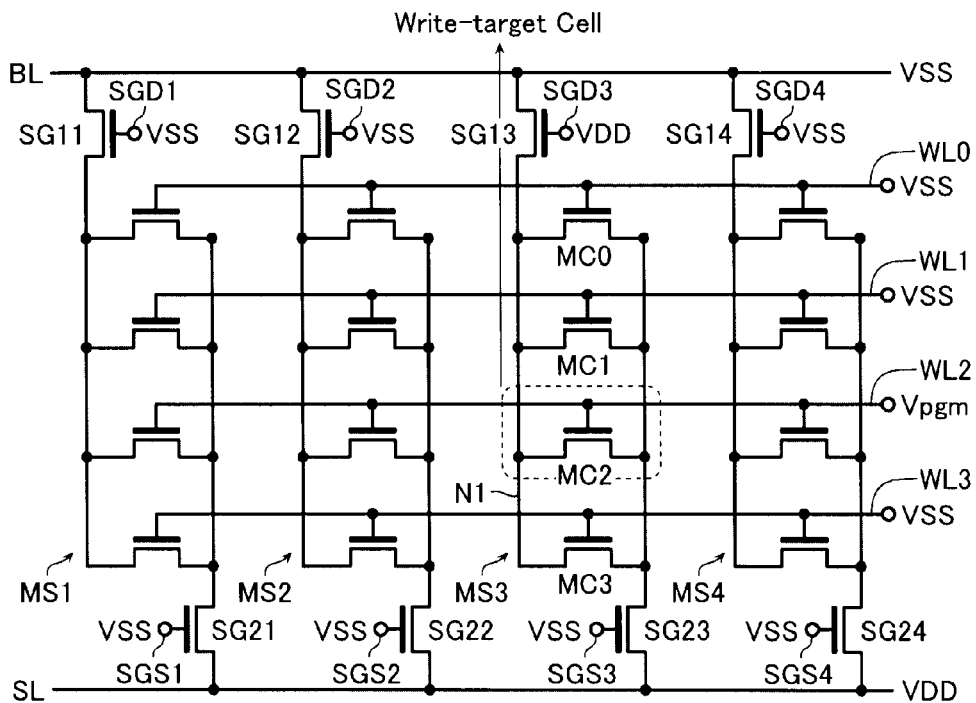
FIG. 7 illustrates the write operation of a non-volatile semiconductor memory device according to the first embodiment.

Referring now to FIG. 7, the write operation will be described. Again, a description is given here of an example in which the memory transistor MC2 of the memory sub-block MS3 is selected to be written.

When the memory transistor MC2 in the memory sub-block MS3 is selected, the source-line SL is applied with the power supply voltage VDD, and the bit-line BL is applied with the ground voltage VSS. Then, only the select-gate-line SGD3 is applied with the power supply voltage VDD to render the first select transistor SG13 conductive, while the remaining select-gate-lines SGD1, SGD2, and SGD4 are applied with the ground voltage VSS to render the first select transistors SG11, SG12, and SG14 non-conductive. The second select transistors SG21 to SG24 are all rendered non-conductive.

Figure 8:
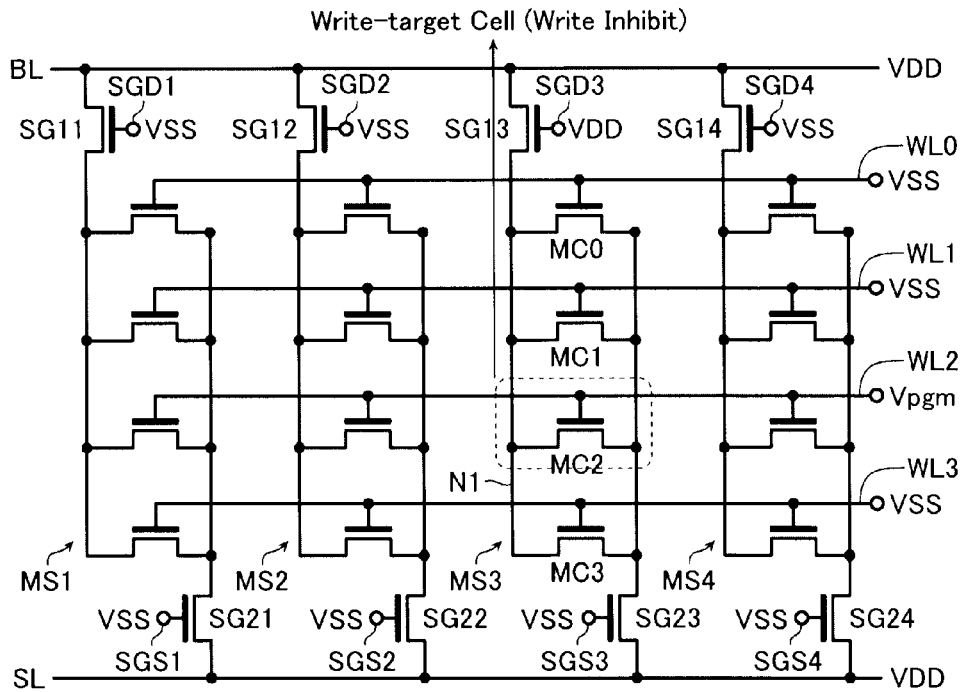
FIG. 8 illustrates the write operation of a non-volatile semiconductor memory device according to the first embodiment.

Thus, only the first node N1 of the memory sub-block MS3 is applied with the ground voltage VSS, and the first nodes N1 of the other memory sub-blocks MS are left floating. In this state, only the selected word-line WL2 is applied with the programming voltage Vpgm, and the other unselected word-lines WL are applied with the ground voltage VSS. Thus, only the gate-source of the selection memory transistor MC2 in the memory sub-block MS3 is applied with a high voltage. Electrons are thus trapped in the charge accumulation film 25B, thereby increasing the threshold voltage of the memory transistor MC2. The write operation to the memory transistor MC2 is thus completed. Note that data "1" may be written in the memory transistor MC2 (to inhibit the change of the threshold voltage (to inhibit write)) by applying the power supply voltage VDD to the corresponding bit-line BL, as shown in FIG. 8. Thus, the first node N1 is left floating, preventing application of the programming voltage Vpgm from performing writing because the potential of the channel of the memory transistor MC2 will be increased by the coupling effect.

Figure 9:
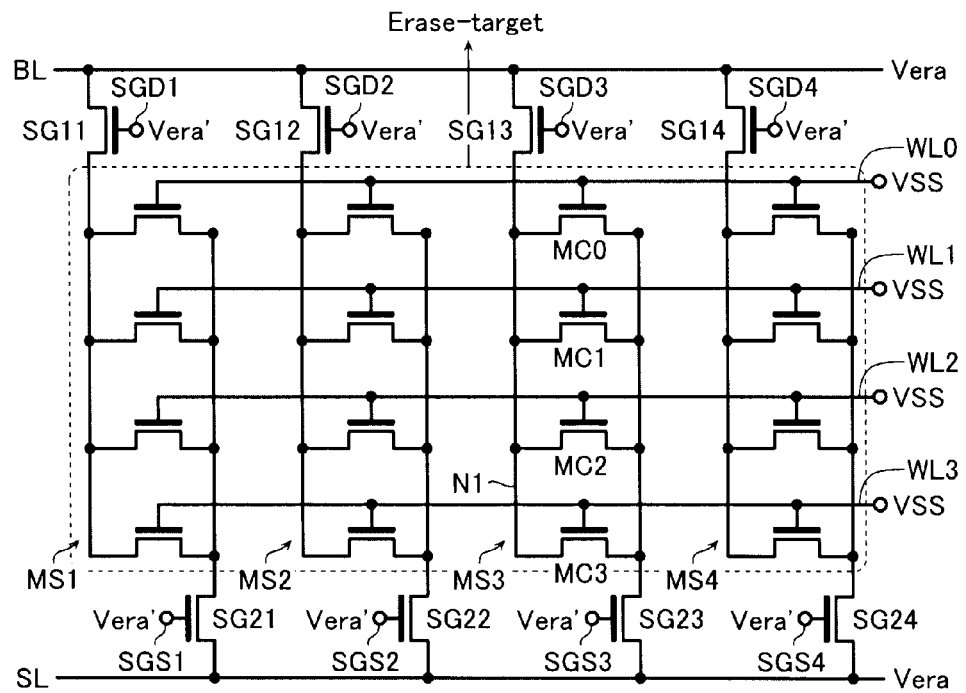
FIG. 9 illustrates the erase operation of a non-volatile semiconductor memory device according to the first embodiment.

Referring now to FIG. 9, the erase operation will be described. A description is given here of an operation in which all memory transistors of the 4 memory sub-blocks MS1 to MS4 along one bit-line BL, the memory sub-blocks MS1 to MS4 electrically sharing a word-line, are collectively erased.

In this case, the bit-line BL and the source-line SL are each applied with an erase voltage Vera (about 20 V). The select-gate-lines SGD1 to SGD4 and SGS1 to SGS4 are applied with a voltage Vera' (=Vera+vth) to render the select transistors SG1 and SG2 conductive. The voltage Vera' is the erase voltage Vera plus the threshold voltage Vth of the select transistors SG1 and SG2. The first node N1 and the second node N2 are all thus charged to the erase voltage Vera.

In this case, if the word-lines WL0 to WL3 are applied with the ground voltage VSS, the gate-source and the gate-drain of the memory transistor MC are applied with a high voltage. Electrons trapped in the charge accumulation film 25B are thus discharged to the channel, decreasing the threshold voltage of the memory transistor MC2. The erase operation of the memory sub-blocks MS1 to MS4 is thus completed.

Although not shown, other methods include biasing Vera" to the p-type well (Vera"=Vera+VF, VF is a voltage for biasing the PN junction in the forward direction). Because the PN junction is biased in the forward direction, the bit-line BL, the source-line SL, the first node N1, and the second node N2 are all charged to the erase voltage Vera.

If then the word-lines WL0 to WL3 are applied with the ground voltage VSS, the gate to source and the gate to drain of the memory transistor MC are applied with a high voltage. Electrons trapped in the charge accumulation film 25B are discharged to the channel, decreasing the threshold voltage of the memory transistor MC2. The erase operation of the memory sub-blocks MS1 to MS4 is thus completed.

The word-lines of the unselected memory sub-blocks except the MS1 to MS4 not electrically sharing a word-line may be applied with the Vera or be left floating not to have the gate-source and the gate-drain of the memory transistor MC applied with a high voltage. The unselected memory sub-blocks are thus unerased.

Figure 10:
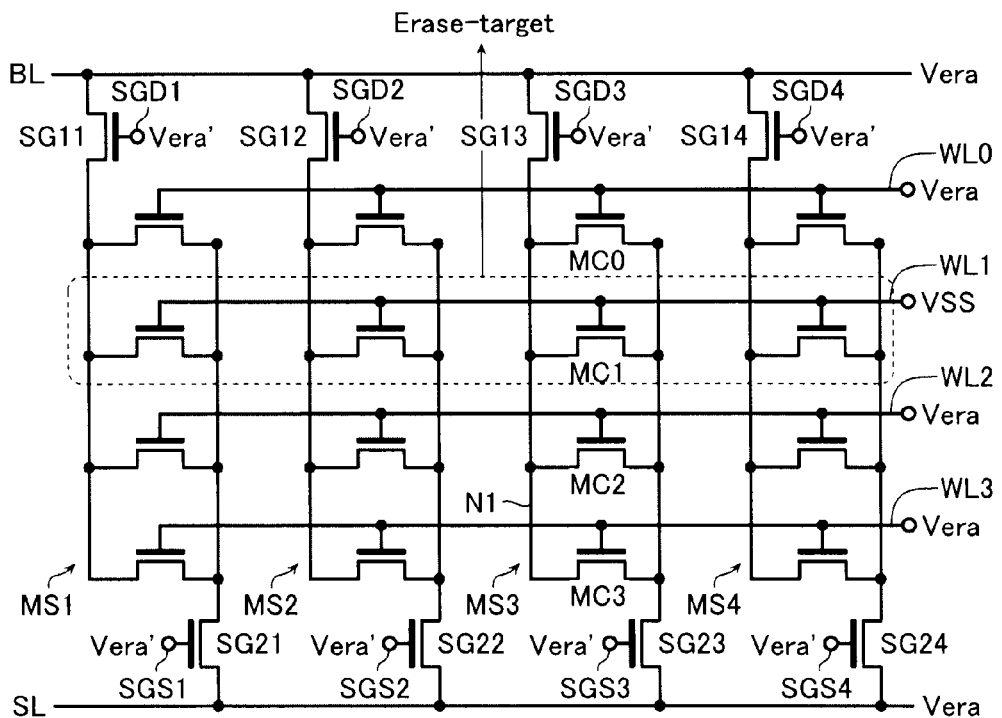
FIG. 10 illustrates the erase operation of a non-volatile semiconductor memory device according to the first embodiment.

FIG. 10 illustrates a different erase operation. A description is given here of an operation in which the memory transistors MC1 (4 transistors) of the 4 memory sub-blocks MS1 to MS4 along one bit-line BL are collectively erased. In this case, only the word-line WL1 may be applied with the ground voltage VSS, and the other word-lines may be applied with the erase voltage Vera. The other voltage application relationships are the same as those in FIG. 9.

Figure 11:
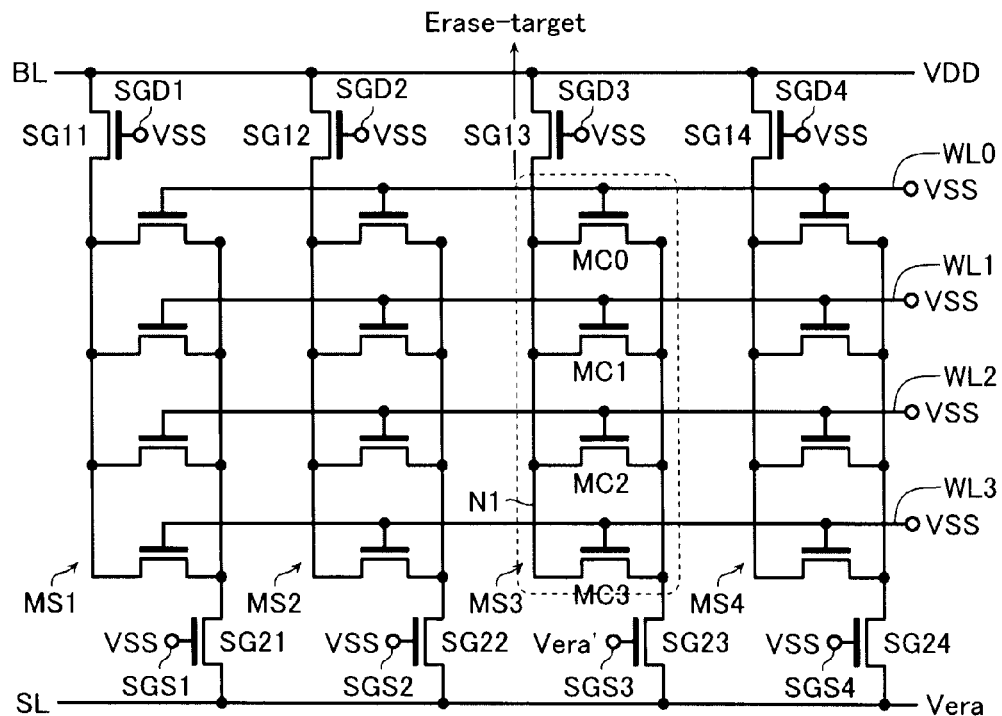
FIG. 11 illustrates the erase operation of a non-volatile semiconductor memory device according to the first embodiment.

Referring now to FIG. 11, still another erase operation will be described. A description is given here of an example in which among the memory sub-blocks MS1 to MS4 along a one bit-line BL, the memory sub-block MS3 is selected, and all memory transistors MC0 to MC3 therein are to be erased.

In this case, with the source-line SL being applied with the erase voltage Vera, the select-gate-line SGS3 is applied with the voltage Vera' and the other select-gate-lines SGS1, SGS2, and SGS4 are applied with the ground voltage VSS. The bit-line BL is applied with the power supply voltage VDD, and the select-gate-lines SGD1 to SGD4 are applied with the ground voltage VSS. In this state, all word-lines WL0 to WL3 are applied with the ground voltage to complete the above erase operation.

Figure 12:
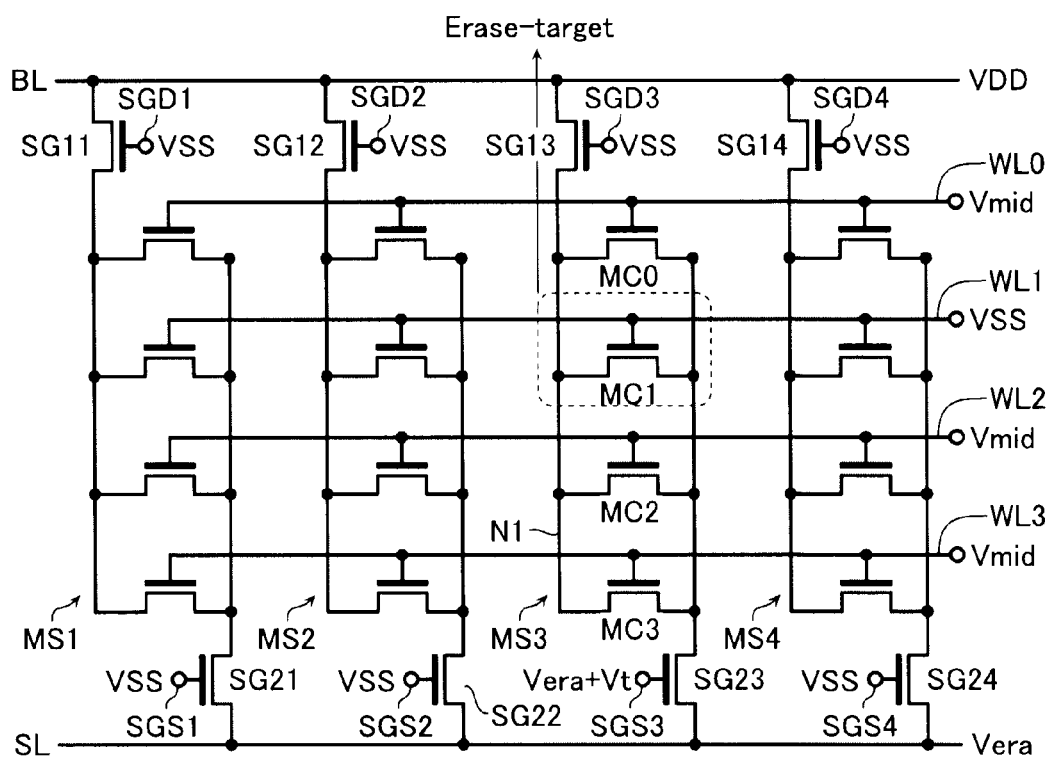
FIG. 12 illustrates the erase operation of a non-volatile semiconductor memory device according to the first embodiment.

Referring now to FIG. 12, a still another erase operation will be described. A description is given here of an example in which among the memory sub-blocks MS1 to MS4 along one bit-line BL, the memory sub-block MS3 is selected, and only the memory transistor MC1 of the memory sub-block MS3 is to be erased.

In this case, only the word-line WL1 is applied with the ground voltage, and the other word-lines WL are applied with a voltage Vmid (about 10 to 12 V) of between the ground voltage VSS and the erase voltage Vera. Otherwise, the operation is similar to that in FIG. 11. The above erase operation is thus completed.

[Manufacture Method in First Embodiment]

Referring now to FIG. 13 to FIG. 19, a method of manufacturing a non-volatile semiconductor device according to the first embodiment will be described.

Figure 13:
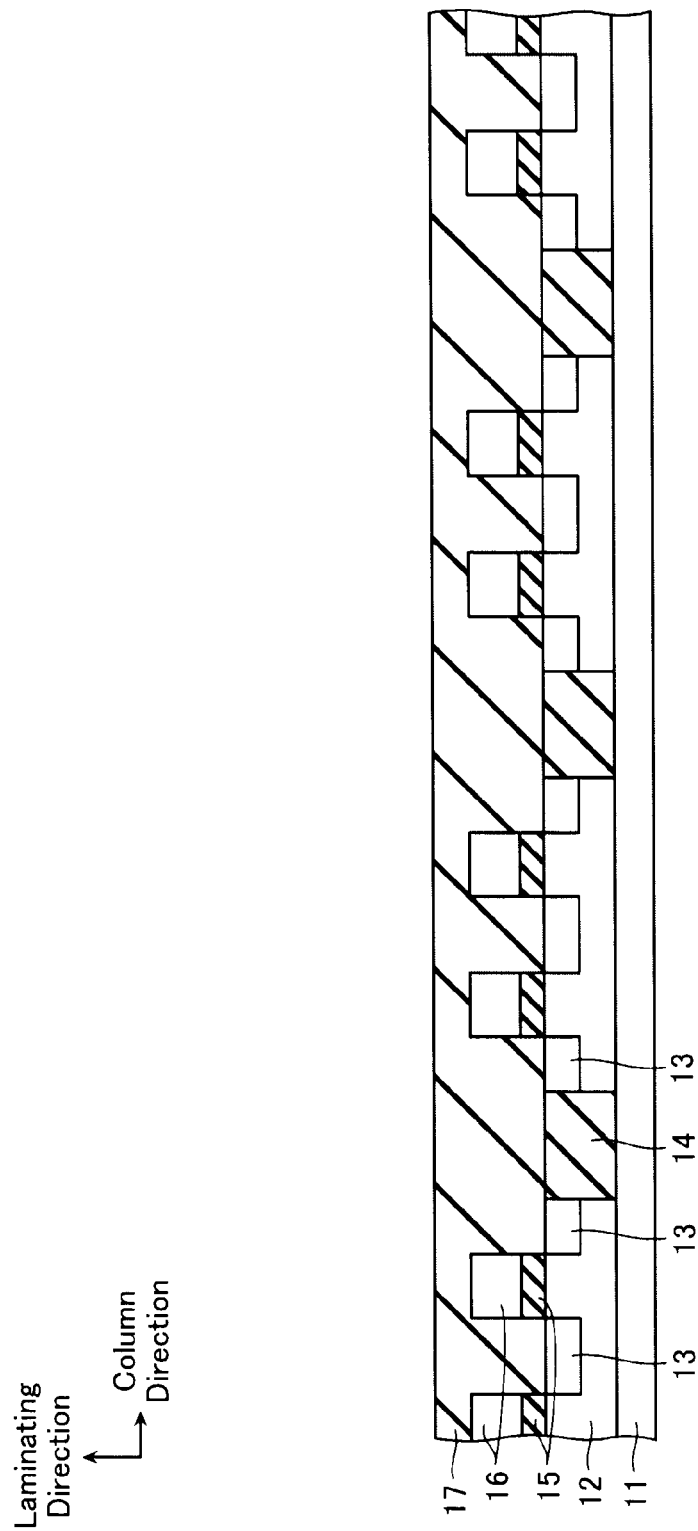
FIG. 13 is a process chart of a manufacture method according to the first embodiment.

Referring first to FIG. 13, on the semiconductor substrate 11, a p-type silicon layer is formed by epitaxial growth. Then, a shallow trench isolation is formed to divide the p-type silicon layer into a matrix in the column direction and in the row direction. An element isolation insulating film 14 such as a silicon oxide film is embedded in the shallow trench isolation to form a plurality of p-type well layers 12 disposed in a matrix.

Each of the p-type well layers 12 is then selectively subjected to an ion implantation to form the n-type diffusion layer 13. A silicon oxide film and polysilicon are then deposited on the entire surface. Then, photolithography is used to pattern the silicon oxide film and polysilicon into a gate electrode film 16 on the p-type well layer 12 as shown in FIG. 13. The gate electrode film 16 extends in the row direction as the longitudinal direction. Further, a silicon oxide film for the interlayer dielectric film 17 is deposited by a process such as sputtering to cover the gate electrode film 16.

Figure 14:
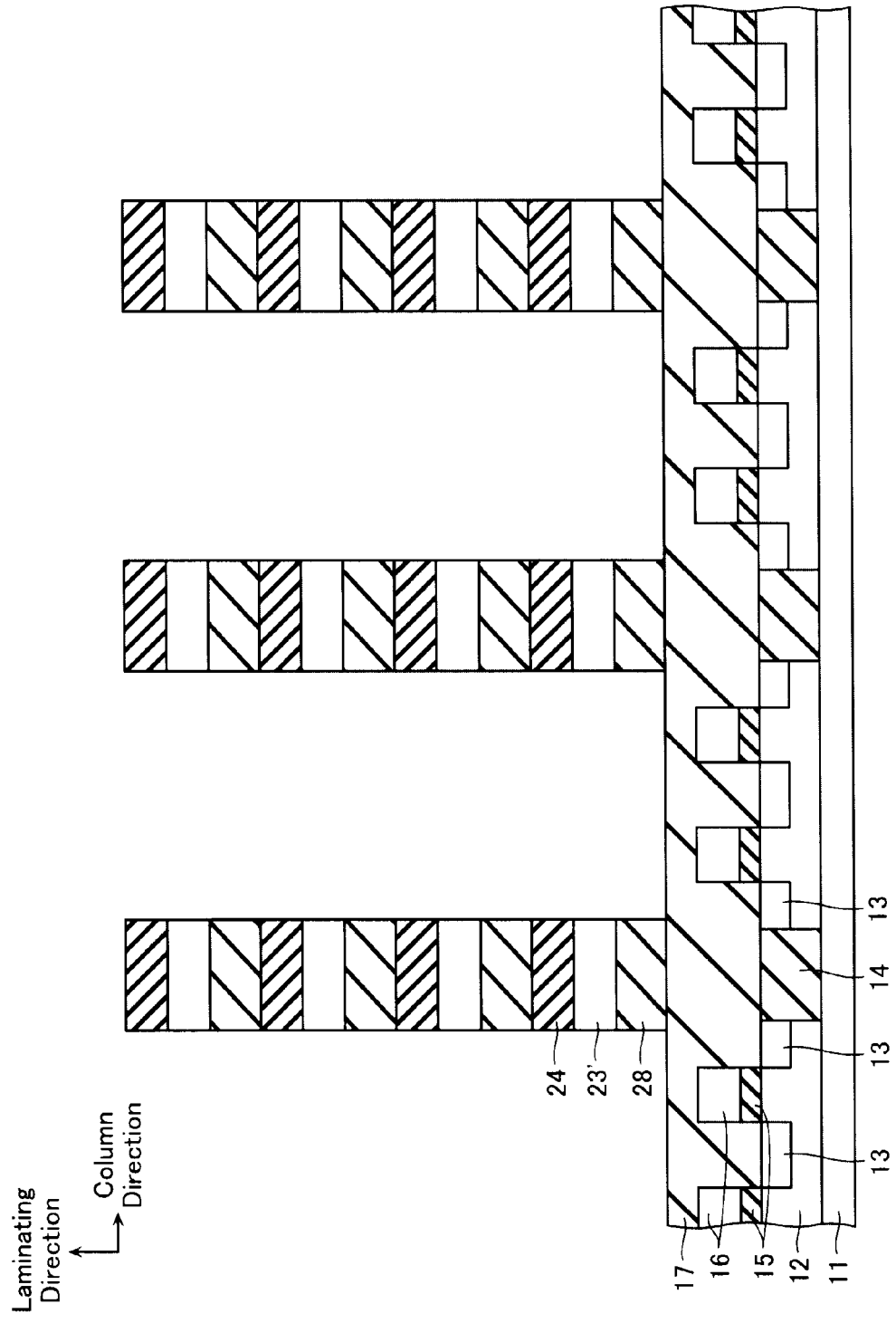
FIG. 14 is a process chart of a manufacture method according to the first embodiment.

Referring now to FIG. 14, on the entire surface of the interlayer dielectric film 17, a plurality of silicon nitride films 28, a plurality of polysilicons 23' for the gate electrode film 23, and a plurality of silicon oxide films 24 are alternately deposited. The films 28, 23', and 24 are then patterned into a stripe shape having a longitudinal direction in the row direction. The silicon nitride film 28 is a film that functions as a sacrificial film to be removed at least in the memory sub-block MS portion in the manufacturing process, as described below.

Figure 15:
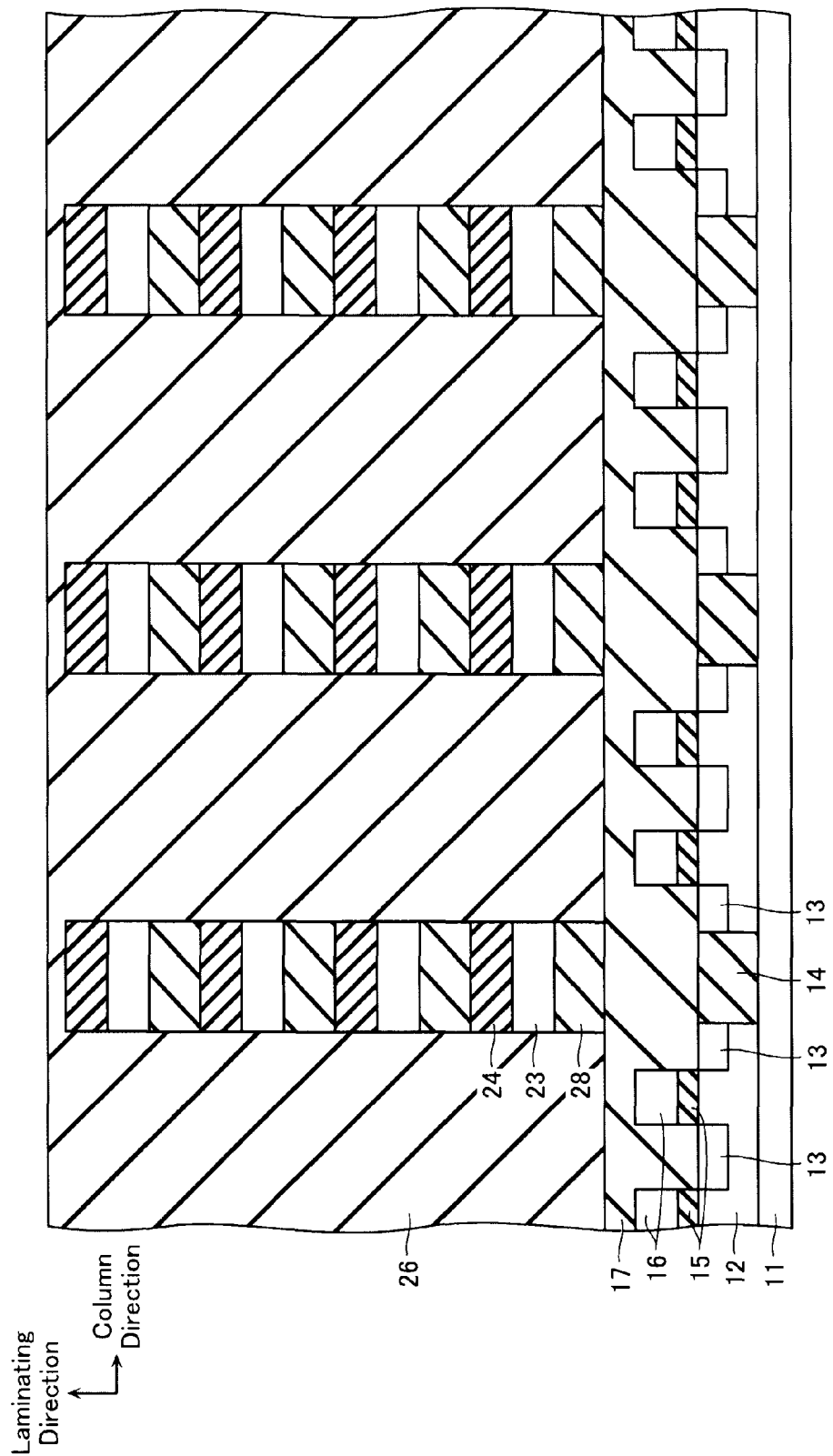
FIG. 15 is a process chart of a manufacture method according to the first embodiment.
Figure 16:
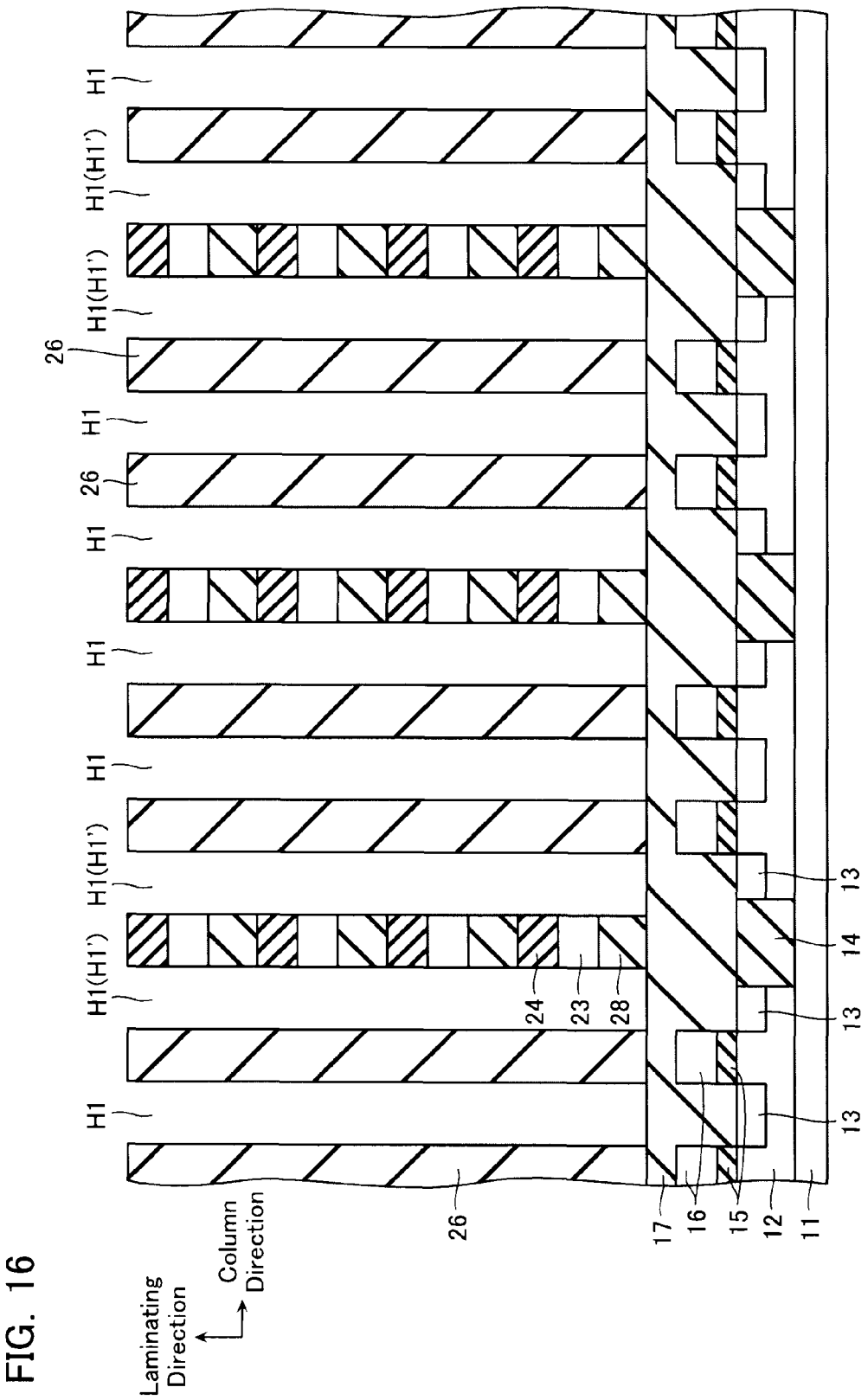
FIG. 16 is a process chart of a manufacture method according to the first embodiment.
Figure 17:
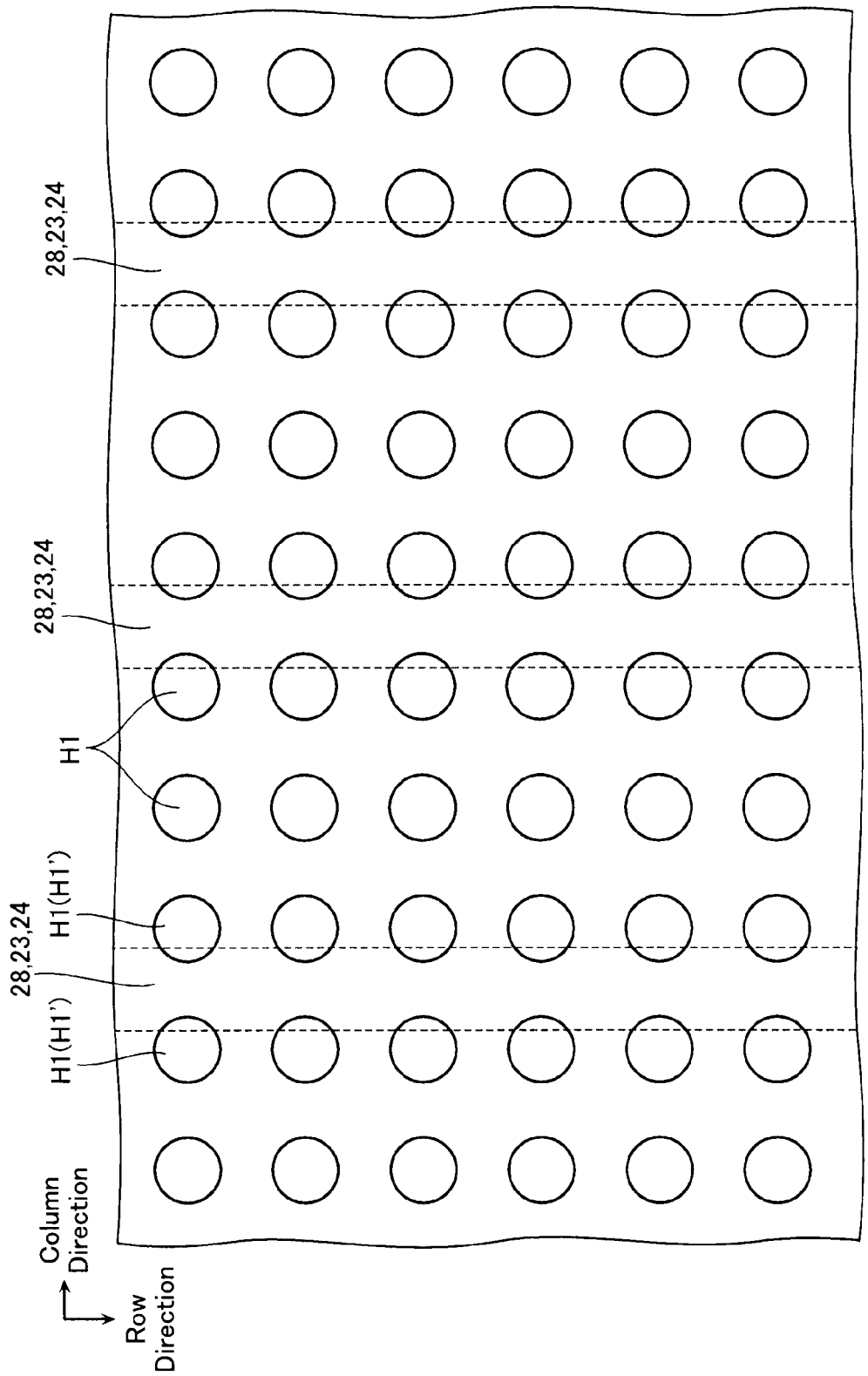
FIG. 17 is a process chart of a manufacture method according to the first embodiment.

Referring then to FIG. 15, the interlayer dielectric film 26 is deposited. Then referring to FIG. 16 and FIG. 17, a plurality of through-holes H1 are formed in a matrix when seen in plan view in the interlayer dielectric film 26. The selection holes H1 are provided corresponding to the positions at which the above first to fourth conductive layers 21A to 21D are to be formed. A portion (H1') of each of the through-holes H1 arranged in the row direction is formed to be partially overlapped with the silicon nitride film 28, the gate electrode film 23, and the silicon oxide film 24. The films 28, 23, and 24 are patterned in the row direction as the longitudinal direction.

Figure 18:
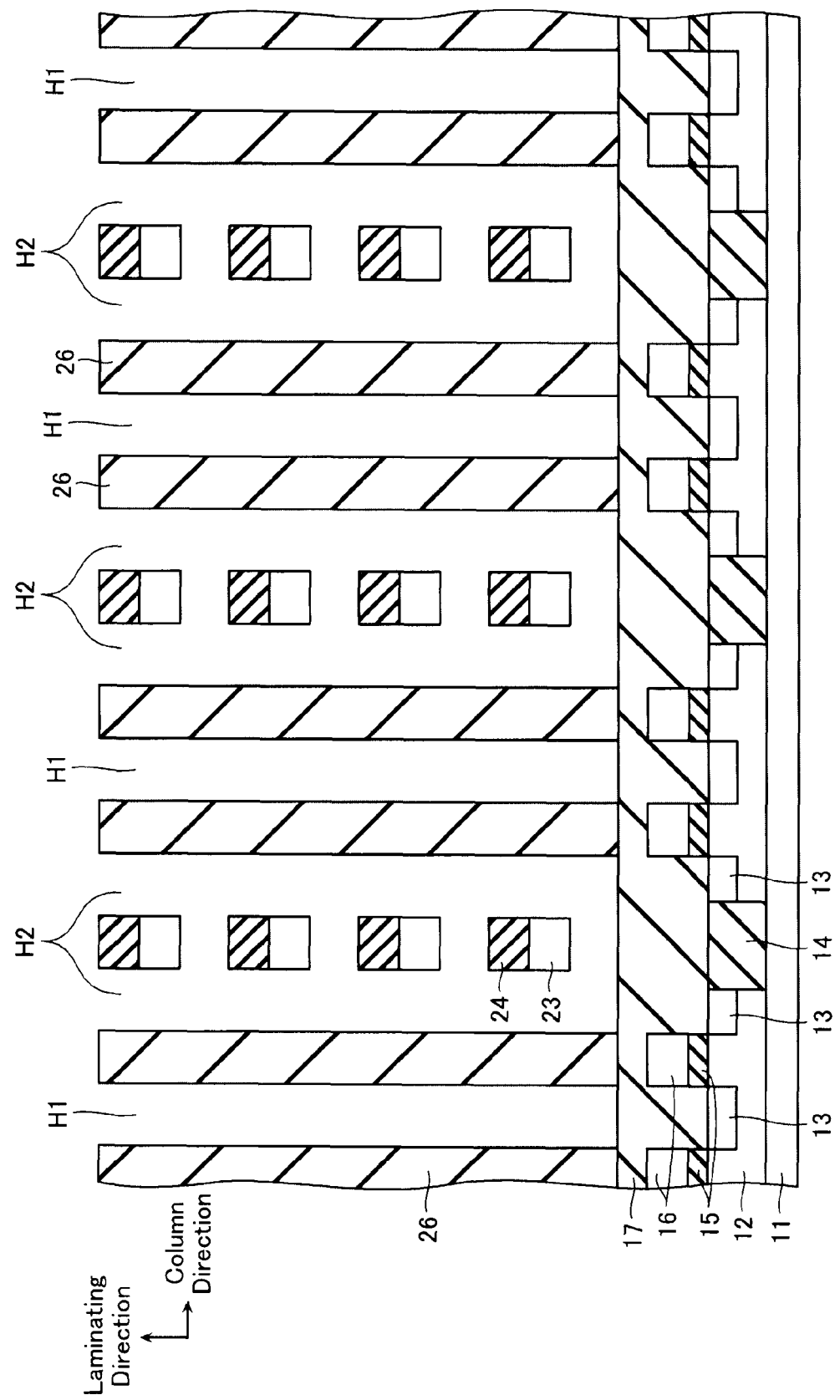
FIG. 18 is a process chart of a manufacture method according to the first embodiment.

Referring then to FIG. 18, the silicon nitride film 28 is selectively removed via the through-hole H1 by a process such as wet etching using a phosphoric acid solution. The removal of the silicon nitride film 28 between two adjacent through-holes H1' connects the two through-holes H1' together, providing the through-hole H2 shown in FIG. 2.

Figure 19:
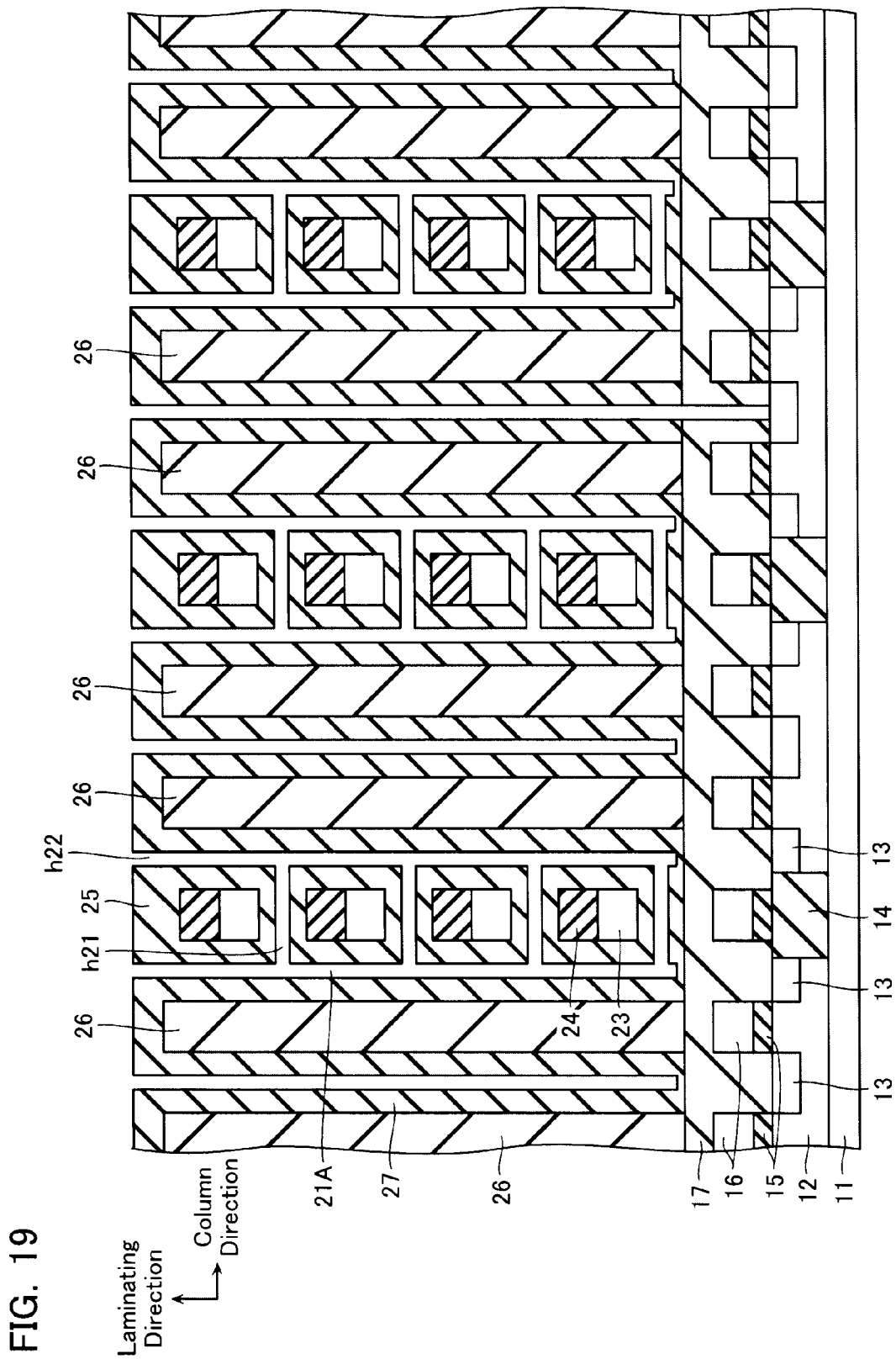
FIG. 19 is a process chart of a manufacture method according to the first embodiment.

Referring then to FIG. 19, the CVD method is used to deposit an ONO film (a 3-layer film of a silicon oxide film, a silicon nitride film, and a silicon oxide film) inside the through-holes H1 and H2. The ONO film is deposited on the side walls of the through-holes H1 and H2. The ONO film is also formed in the periphery of the gate electrode 23 and the silicon oxide film 24 in a rolled manner in the A-A' cross-section. The gate electrode 23 and the silicon oxide film 24 are integrally formed extending in the row direction as the longitudinal direction.

Figure 20:
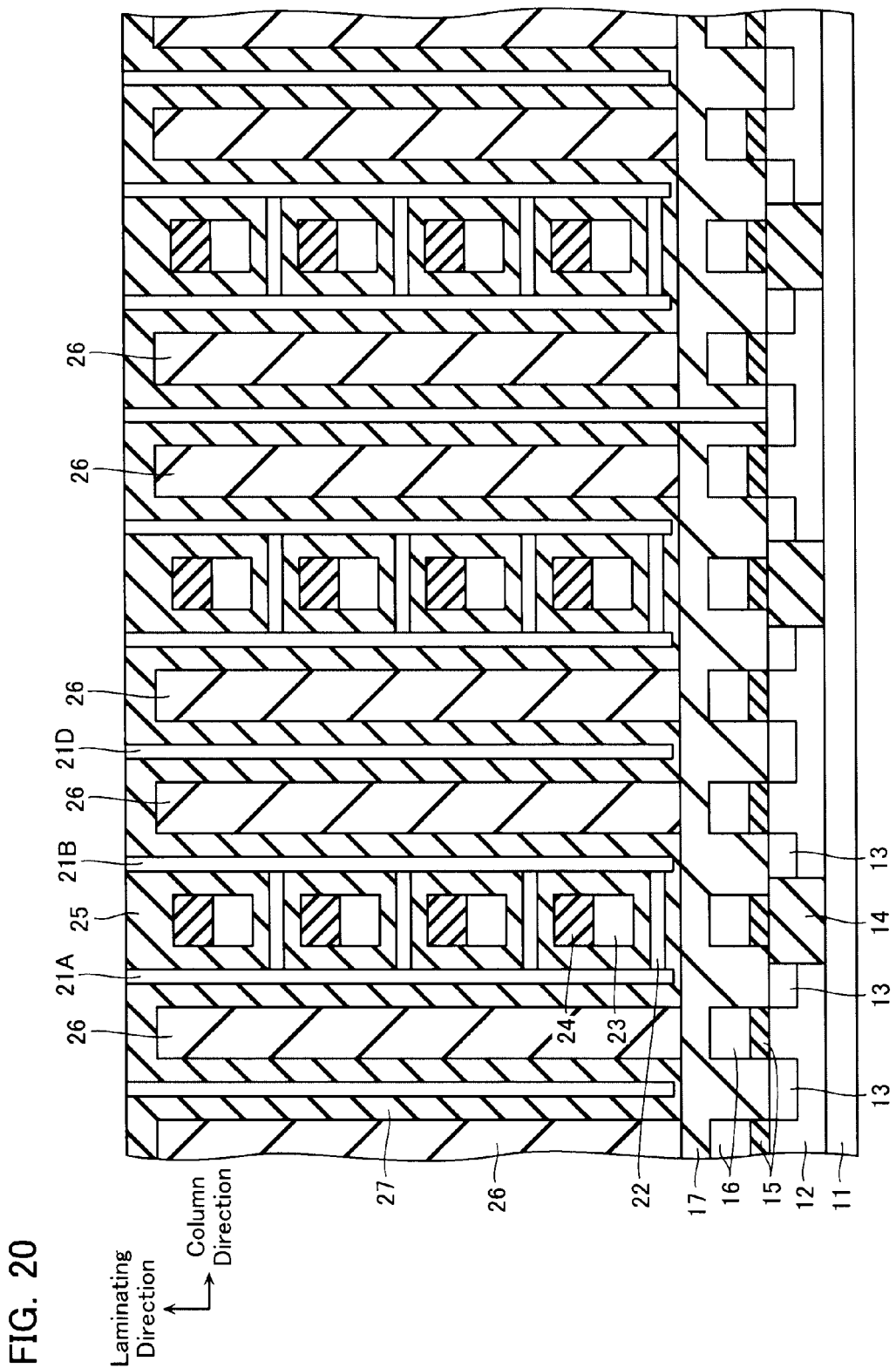
FIG. 20 is a process chart of a manufacture method according to the first embodiment.

Each ONO film is formed to a thickness that prevents the ONO films in a rolled manner from being contacted with each other in the vertical direction and prevents each ONO film from being contacted with the ONO films formed on the side wall. Specifically, the ONO film is formed to incompletely fill in the through-hole H1 and the through-hole H2. In other words, a void h21 is left between the silicon oxide film 24 and the gate electrode film 23, and a void h22 is left between the silicon oxide film 24 and gate electrode film 23 and the side wall of through-hole H2. The resulting voids h21 and h22 are further subjected to the CVD method to have a silicon film formed therein. The silicon film provides the semiconductor layer 22. Further, the silicon film embedded in the void h22 and the silicon film formed in the through-hole H1 are removed again. A tungsten layer is then formed in the resulting voids by sputtering. The tungsten layer provides the first to fourth conductive layers 21A to 21D (see FIG. 20). Then, the interconnection layer 30 is formed by a well-known method to complete the structure in FIG. 2 to FIG. 5.

[Effects in First Embodiment]

The advantages of a non-volatile semiconductor memory device according to the first embodiment will now be described. In this embodiment, the memory cell array includes an arrangement of the memory sub-blocks, each including a plurality of memory transistors MC connected in parallel. It may thus be easier in this embodiment to increase the read current than in the stacked NAND flash memory that includes an arrangement of memory strings, each including a plurality of memory transistors connected in series.

Figure 32:
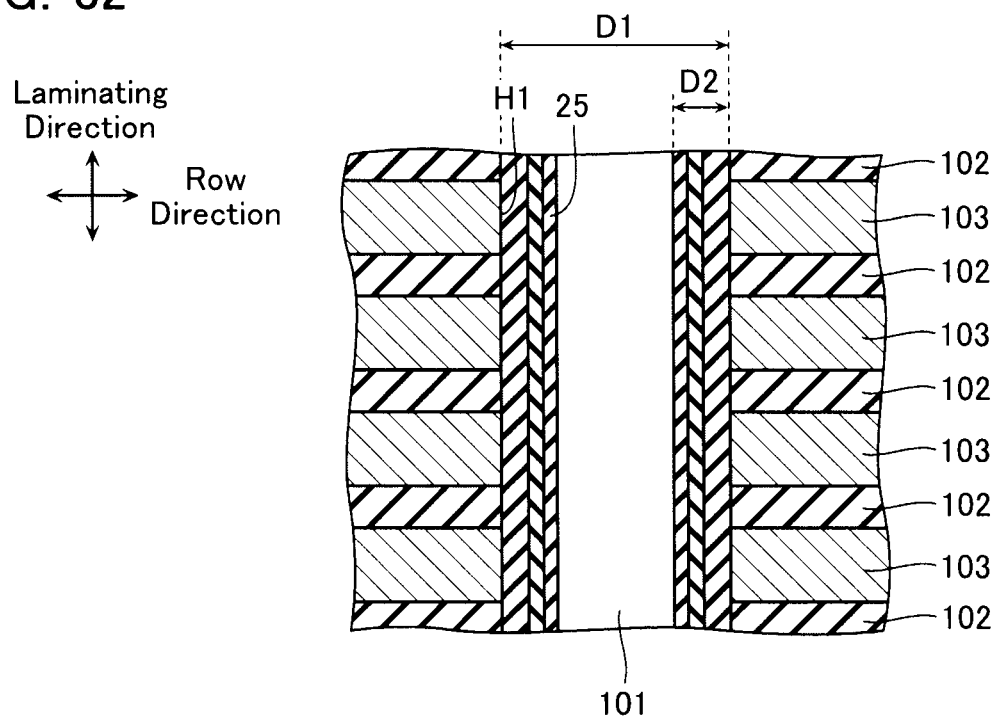
FIG. 32 shows the comparative example to the embodiment.

In this embodiment, the thickness of the semiconductor layer 22 forming a channel may be determined with a high degree of freedom independent of the advance of miniaturization. Any required amount of read current may thus be readily ensured. As a comparative example, FIG. 32 shows the structure of a memory string of a stacked NAND flash memory. The stacked NAND flash memory includes an interlayer dielectric film 102 and a conductive layer 103 alternately deposited in the laminate direction. The conductive layer 103 works as a word-line. The memory also includes a through-hole H1 formed passing through the film 102 and the layer 103. The memory also includes an ONO film 25 deposited on the side wall of the through-hole H1. The ONO film 25 functions as a charge accumulation film of the memory. Polysilicon 101 is then embedded in the remaining portion of the through-hole H1. The polysilicon 101 functions as the channel portions of a plurality of memory transistors connected in series in the memory string.

However, the advance of miniaturization decreases the diameter D1 of the through-hole H1 and thus decreases the diameter of the polysilicon portion, thereby reducing the read current flow accordingly. It is impossible to reduce the thickness D2 of the ONO film 25 in proportion to the advance of miniaturization. Therefore, the stacked NAND flash memory cannot avoid the read current decrease caused by the advance of miniaturization.

In this embodiment, the first/second conductive layers 21A and 21B may be formed of metal such as tungsten. The thickness of the semiconductor layer 22 may be set to a value corresponding to the required amount of read current regardless of the advance of miniaturization. Therefore, regardless of the advance of miniaturization, the required read current may be ensured.

Note that in this embodiment, the silicon oxide film 24 is formed on the gate electrode film 23. If, for example, the gate electrode film 23 is applied with a certain voltage, the silicon oxide film 24 causes the voltage to act only on the semiconductor layer 22 below the gate electrode film 23, but not on the semiconductor layer 22 disposed above the gate electrode film 23 via the silicon oxide film 24. In this way, the silicon oxide film 24 helps to eliminate the reading/write disturb for a memory transistor in a different layer.

Also, in this embodiment, the first and second select transistors SG1 and SG2 are grown on a well formed on the semiconductor substrate 11 as a single crystal structure by epitaxial growth. Therefore, good cut-off characteristics of the select transistors SG1 and SG2 may be provided.

(Second Embodiment)

Figure 21:
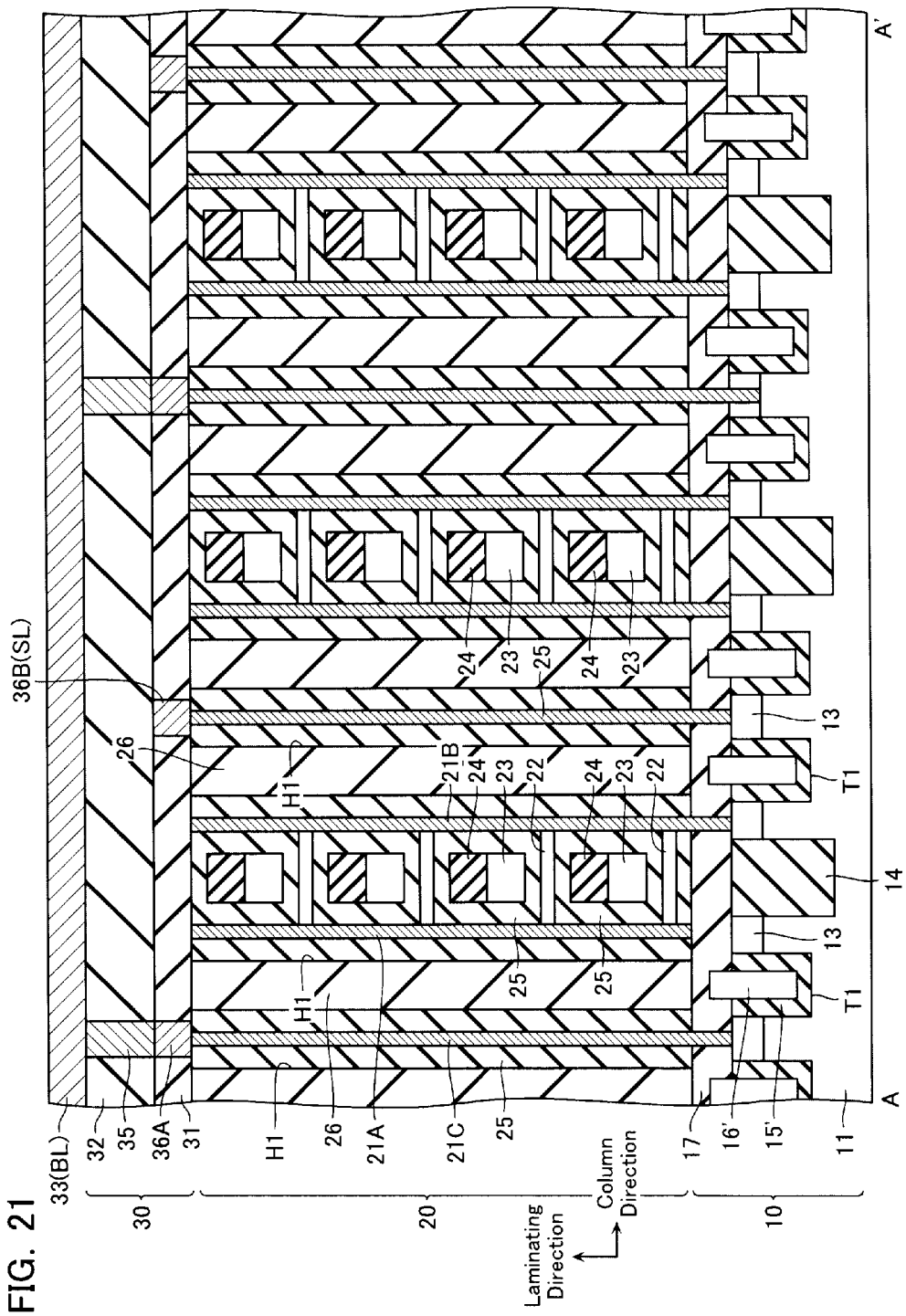
FIG. 21 is a cross-sectional view of a structure of a memory cell array portion of a non-volatile semiconductor memory device according to a second embodiment.

Referring now to FIG. 21, a non-volatile semiconductor memory device according to a second embodiment will be described. The equivalent circuit diagram of the memory cell array and the structure of the memory cell array when seen in plan view are generally the same as those in the first embodiment (FIG. 1 and FIG. 2). Further, the structures of the memory layer 20 and the interconnection layer 30 are generally the same as those described in FIG. 3 to FIG. 5.

Note, however, that the structure of the select transistor layer 10 in this embodiment differs from that in the first embodiment. In the select transistor layer 10, the first select transistors SG1 and SG2 are formed using a so-called trench gate transistor. A trench T1 is formed in the surface of the semiconductor substrate 11 between the element isolation insulating films 14. A gate-insulating film 15' and a gate electrode film 16' are embedded in the trench T1. Further, in the surface of the semiconductor substrate 11 except the trench T1, the n-type diffusion layer is formed. The layer 13 provides the source/drain diffusion layers of the select transistors SG1 and SG2. It should be understood that although FIG. 21 shows that no well layer corresponding to the p-type well layer 12 in FIG. 3 is formed and the n-type diffusion layer 13 is directly formed in the semiconductor substrate 11, a similar well layer 12 may be formed.

Figure 22:
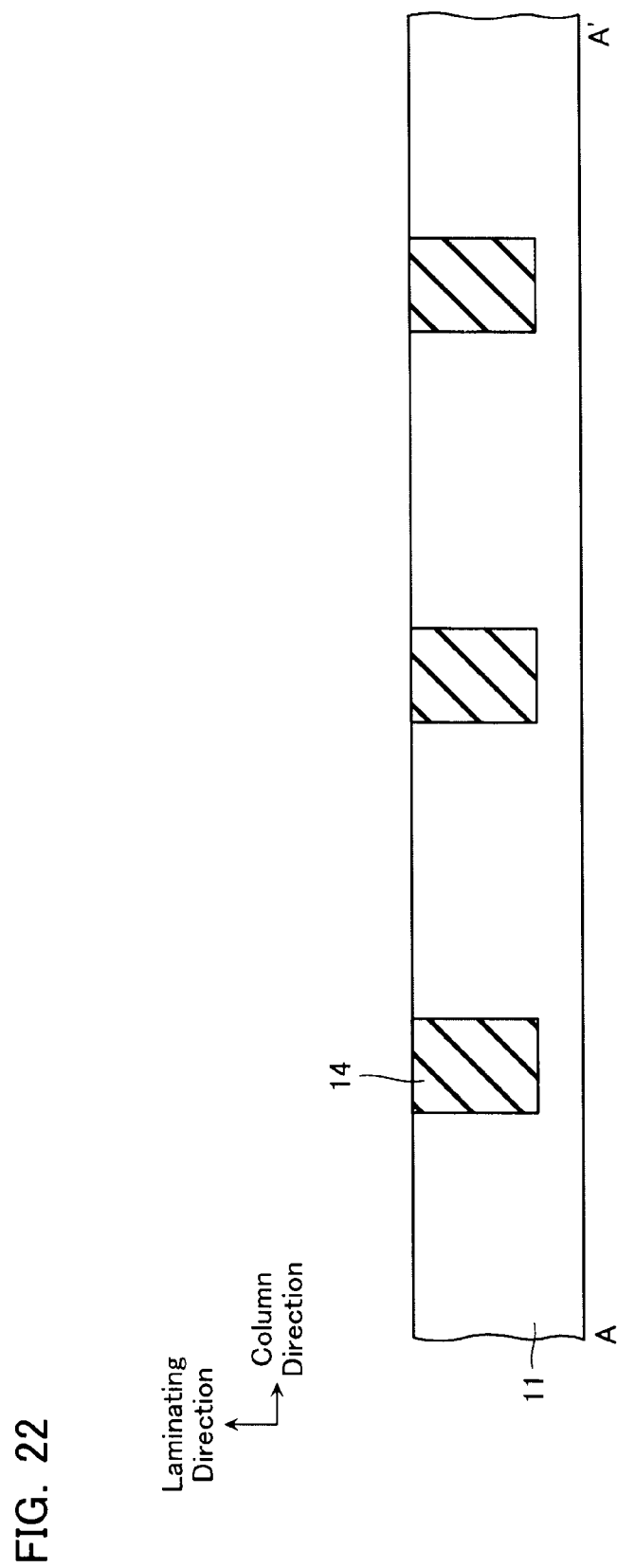
FIG. 22 is a process chart of a manufacture method according to the second embodiment.
Figure 23:
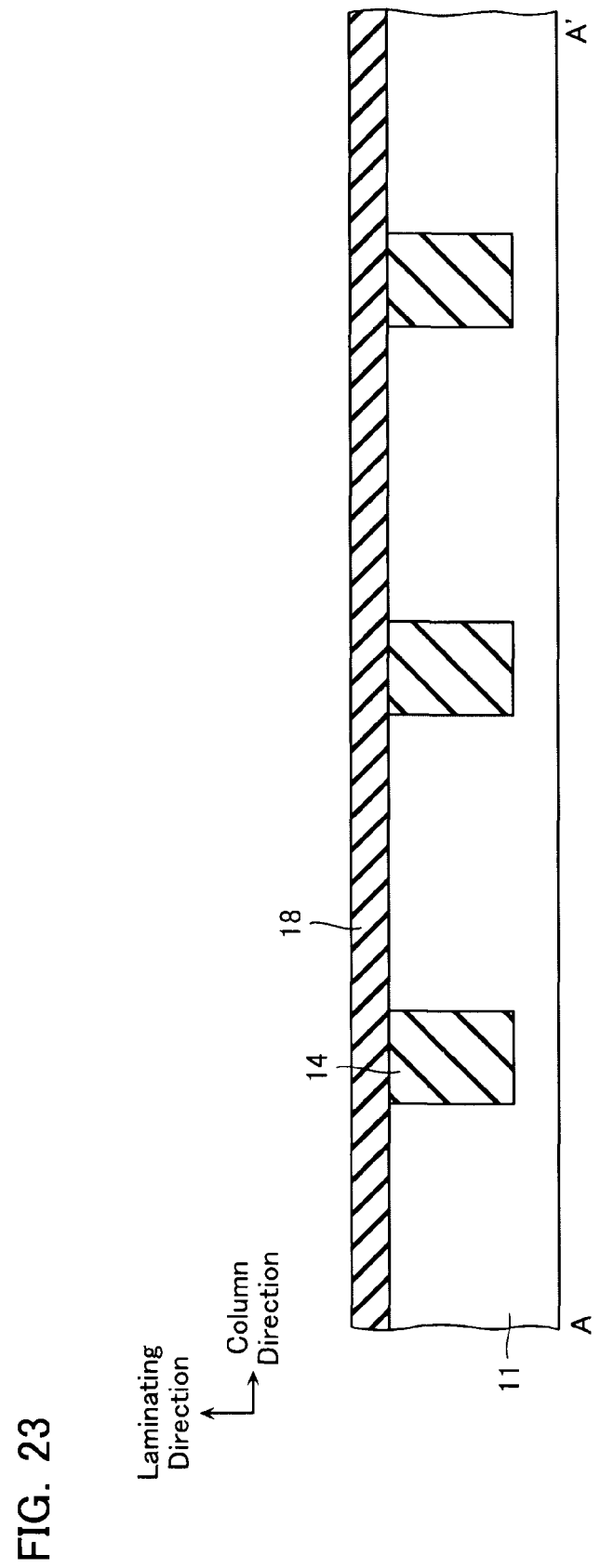
FIG. 23 is a process chart of a manufacture method according to the second embodiment.

FIG. 22 to FIG. 26 show a method of manufacturing the select transistor layer 10 according to the second embodiment. With reference to FIG. 22 to FIG. 23, the element isolation insulating films 14 are formed at regular intervals in the semiconductor substrate 11, and then a silicon nitride film 18 is formed over the entire surface of the semiconductor substrate 11.

Figure 24:
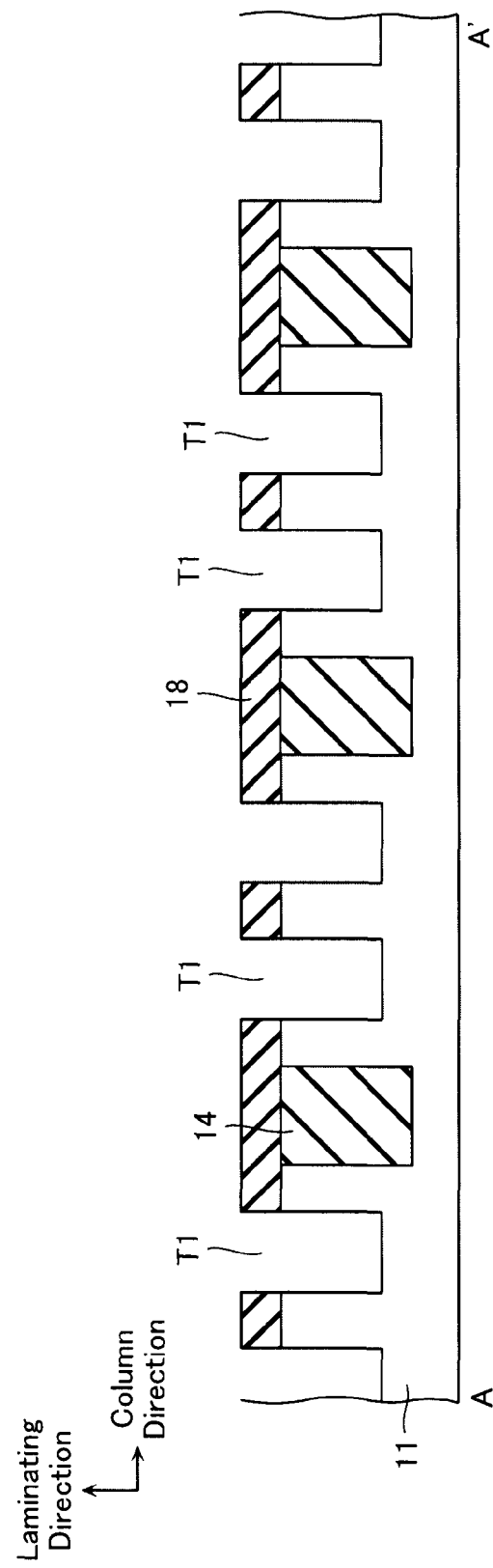
FIG. 24 is a process chart of a manufacture method according to the second embodiment.
Figure 25:
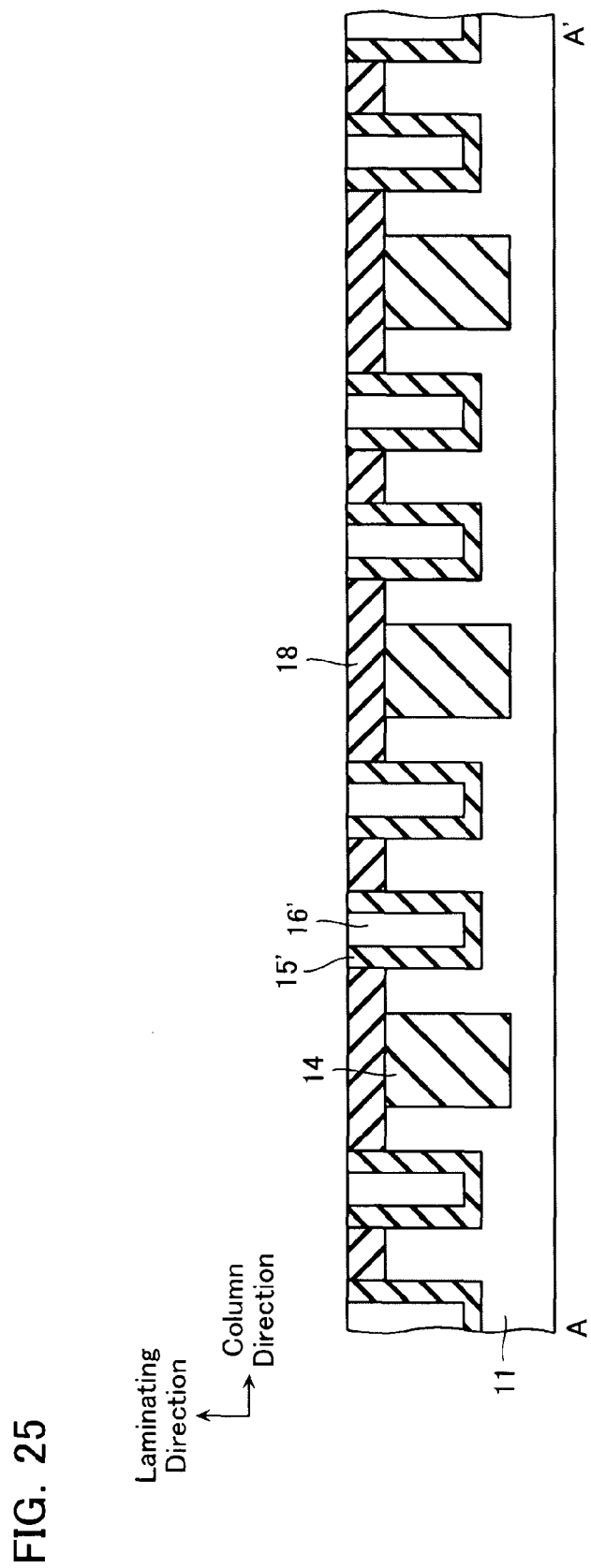
FIG. 25 is a process chart of a manufacture method according to the second embodiment.
Figure 26:
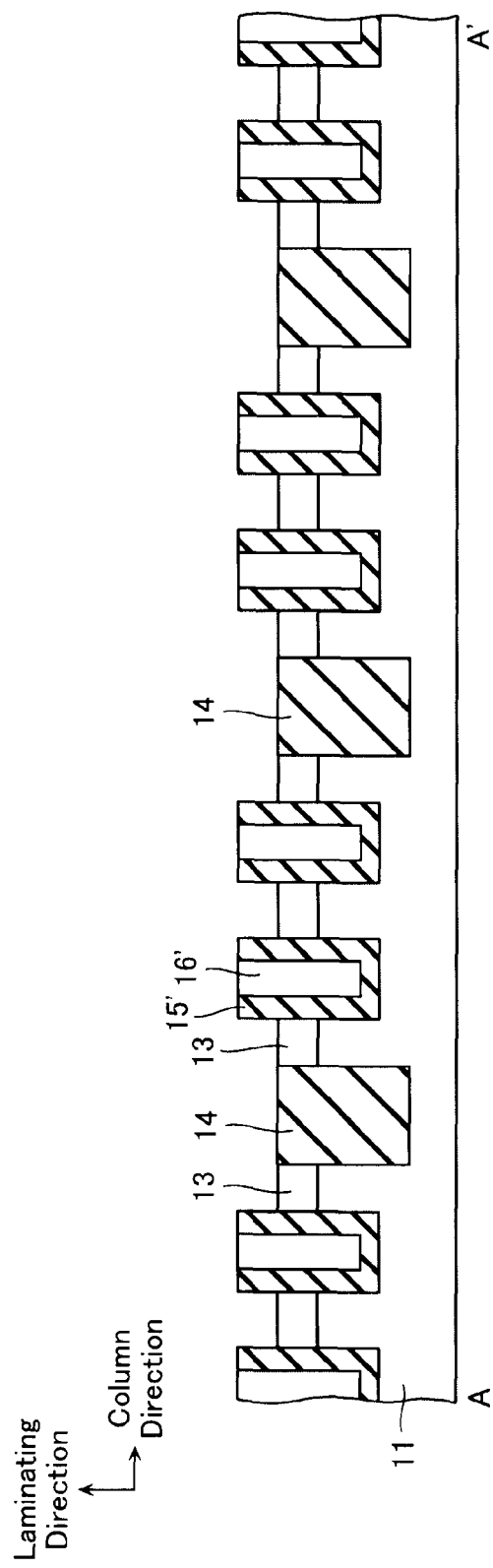
FIG. 26 is a process chart of a manufacture method according to the second embodiment.

Then, two trenches T1 are formed in the surface of the semiconductor substrate 11 between the two element isolation insulating films 14 (FIG. 24). Then, the gate-insulating film 15' and the gate electrode film 16' are embedded in each trench T1. Referring finally to FIG. 25 and FIG. 26, the silicon nitride film 18 is etched away and the interlayer dielectric film 17 is deposited on the resulting surface. The select transistor layer 10 is thus completed.

(Third Embodiment)

Figure 27:
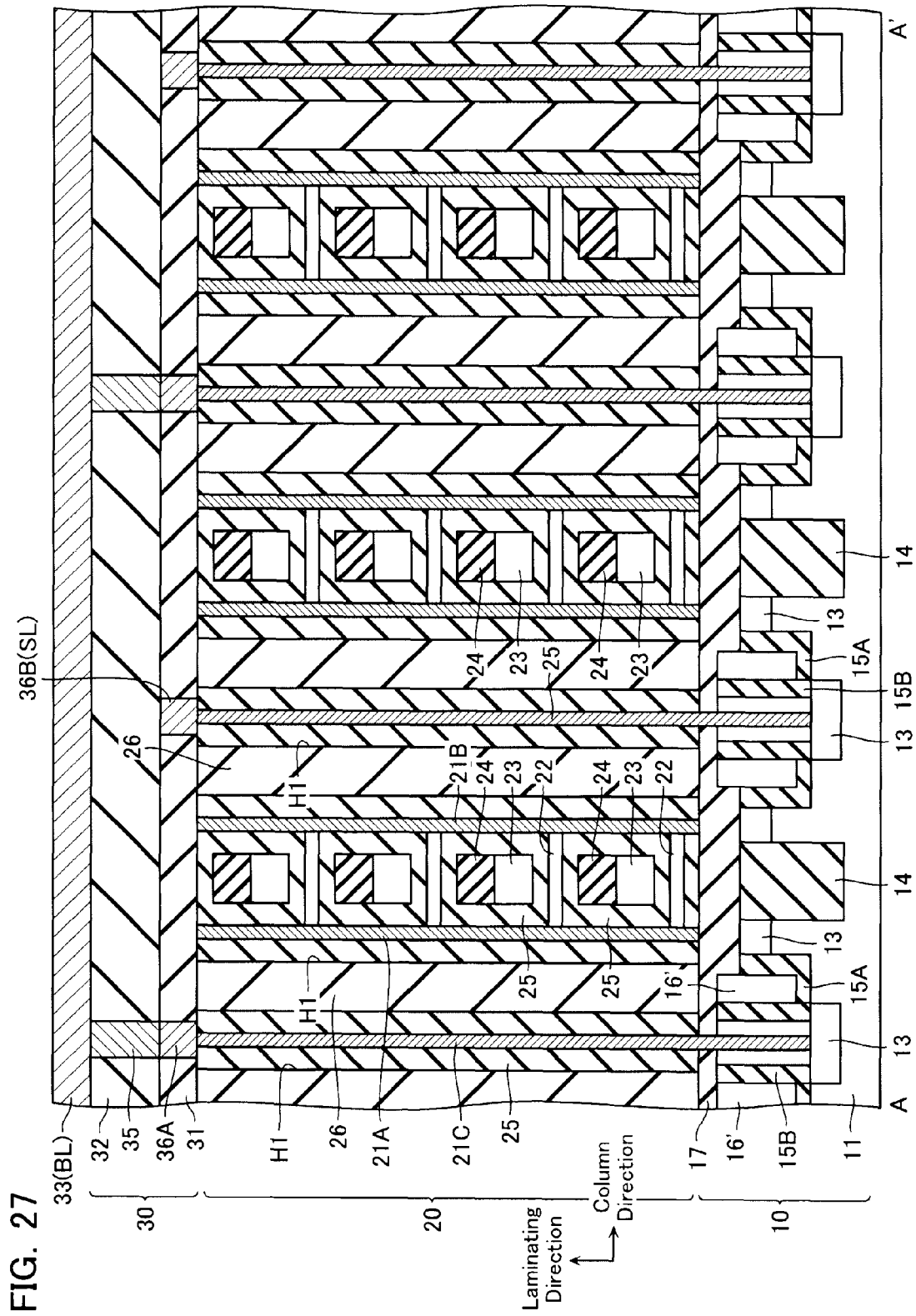
FIG. 27 is a cross-sectional view of a structure of a memory cell array portion of a non-volatile semiconductor memory device according to a third embodiment.

Referring now to FIG. 27, a non-volatile semiconductor memory device according to a third embodiment will be described below. The equivalent circuit diagram of the memory cell array and the structure of the memory cell array when seen in plan view are generally the same as those in the first embodiment (FIG. 1 and FIG. 2). Further, the structures of the memory layer 20 and the interconnection layer 30 are generally the same as those described in FIG. 3 to FIG. 5.

In this embodiment, the first select transistors SG1 and SG2 are formed in the select transistor layer 10 using a so-called trench gate transistor. Note, however, that, in this embodiment, one trench is formed in a surface of the semiconductor substrate 11 between the two element isolation insulating films 14, and then the gate-insulating films 15A and 15B and the gate electrode film 16'are embedded in the trench.

Figure 28:
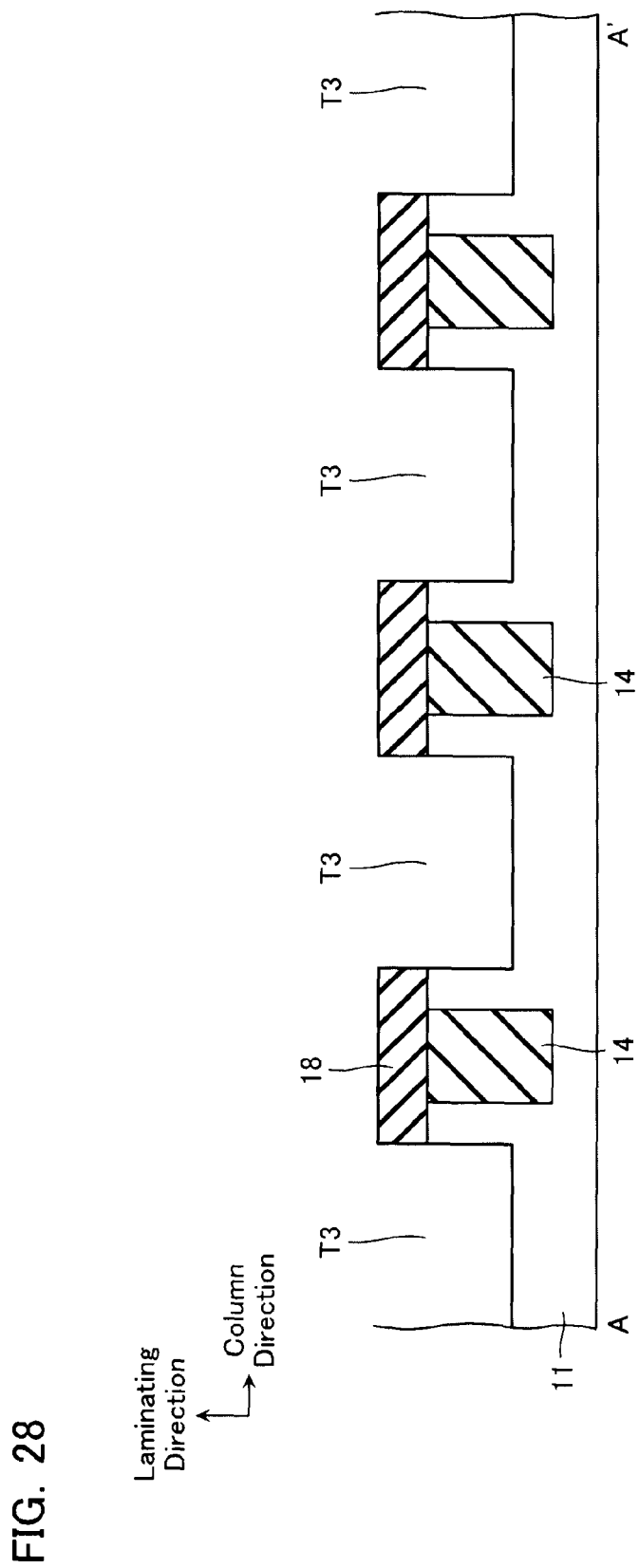
FIG. 28 is a process chart of a manufacture method according to the third embodiment.
Figure 29:
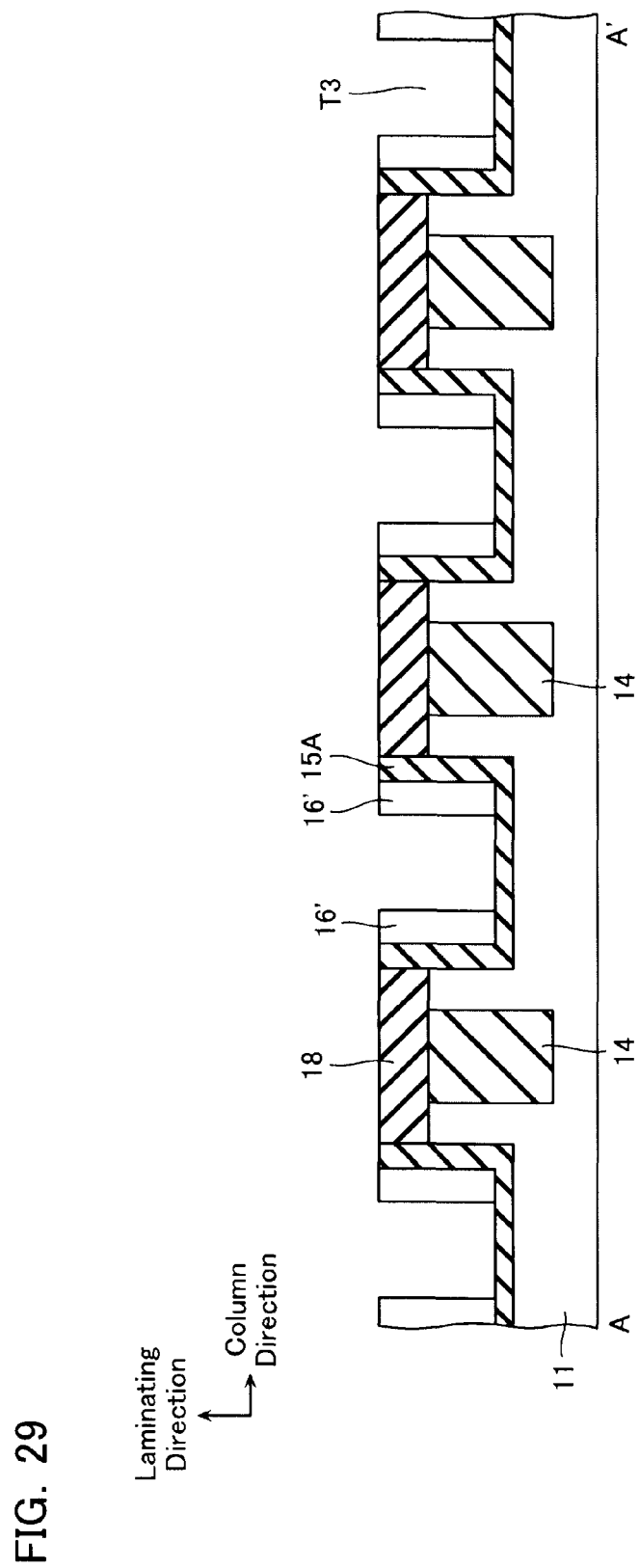
FIG. 29 is a process chart of a manufacture method according to the third embodiment.
Figure 30:
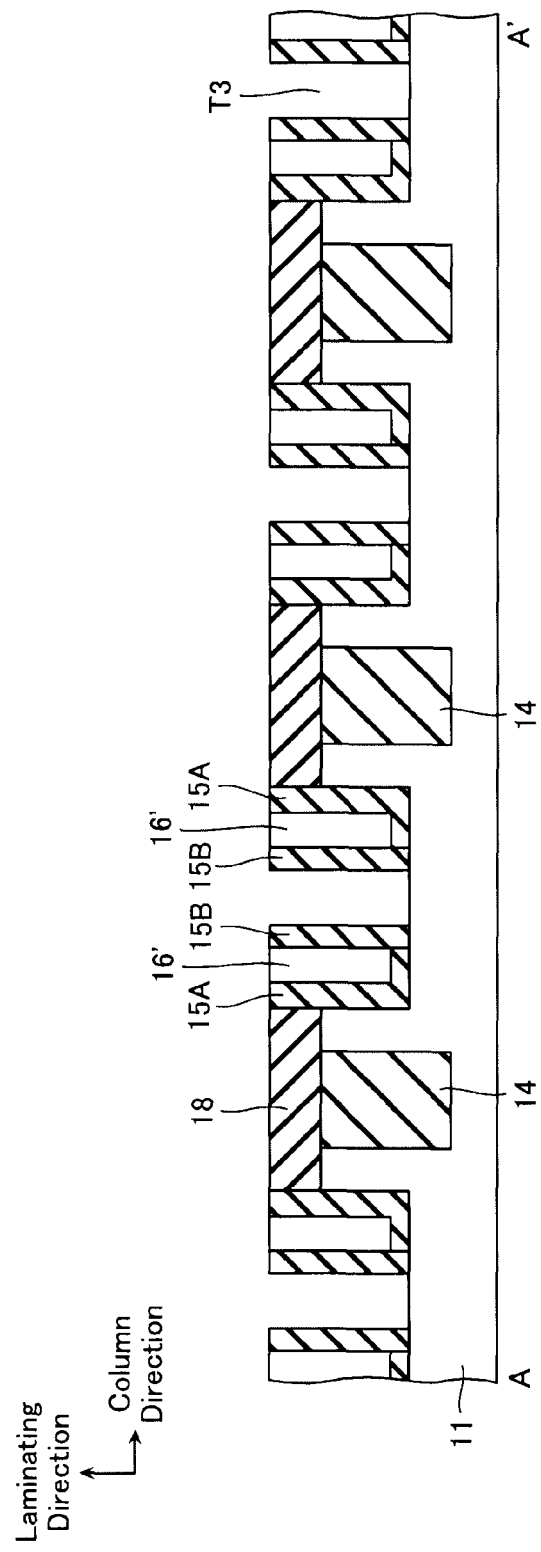
FIG. 30 is a process chart of a manufacture method according to the third embodiment.
Figure 31:
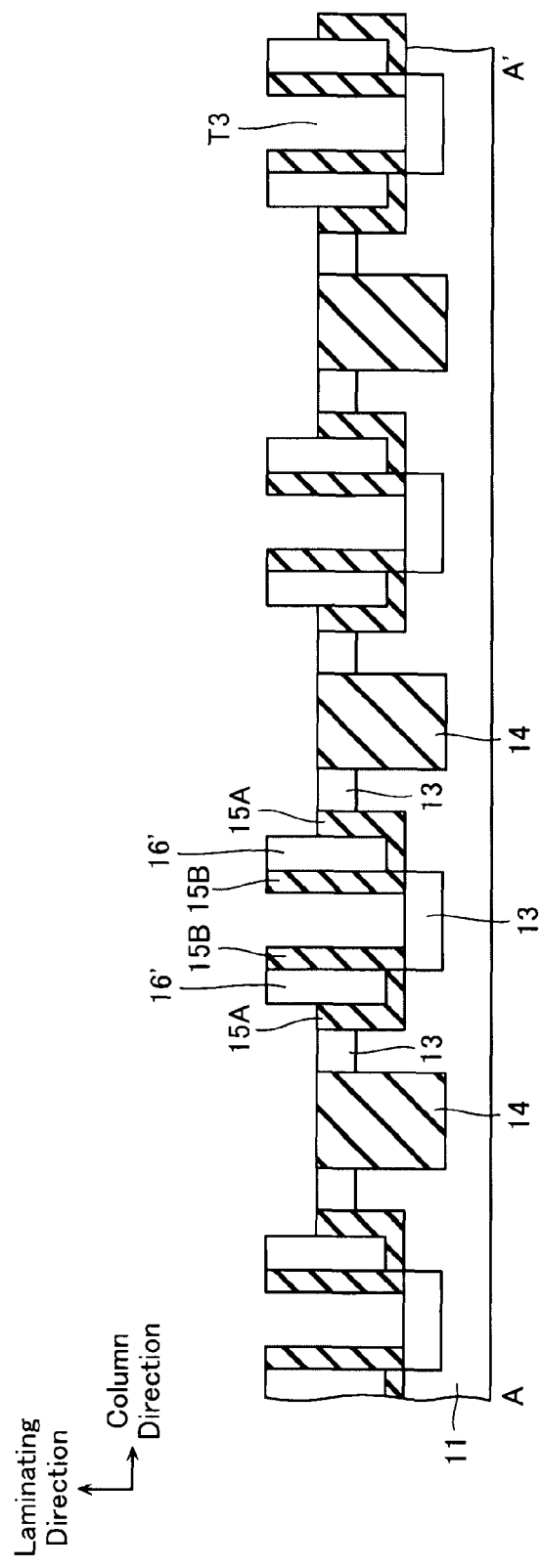
FIG. 31 is a process chart of a manufacture method according to the third embodiment.

FIG. 28 to FIG. 31 illustrate a method of manufacturing the select transistor layer 10 according to the third embodiment. First, the same steps as shown in FIG. 22 to FIG. 23 are performed. Then, one trench T3 is formed in a surface of the semiconductor substrate 11 between the two element isolation insulating films 14 (FIG. 28). Then, the gate-insulating film 15A and gate electrode film 16' are embedded in the trench T3. Further, the gate electrode film 16' is subjected to self-alignment etching to remove the gate-insulating film 15A on the bottom of the trench T3. Then, the gate-insulating film 15B is deposited on the side walls of the gate electrode films 16'. Then, the interlayer dielectric film 17 is deposited over the entire surface to complete the structure of the select transistor layer 10 in FIG. 27.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

For example, although the conductive layers 21A to 21D are metal films such as tungsten in the above examples, any material such as polysilicon that provides the required conductivity may be used.

Moreover, although the film 25 is an ONO film, a 3-layer structure of the aluminum oxide film 25A (AlO), the silicon nitride film 25B (SiN), and the silicon oxide film 25C (SiO2), and other configurations may be used.

Although the above embodiments use a structure in which the semiconductor substrate 11 bears the semiconductor layer 22, the gate electrode film 23, and the silicon oxide film 24 that are deposited thereon in this order, the gate electrode film 23 and the silicon oxide film may be replaced and the semiconductor layer 22 may be provided above the gate electrode film 23 to form one memory transistor.

What is claimed is:

1. A non-volatile semiconductor memory device comprising:
    a semiconductor substrate;
    an dielectric film formed above the semiconductor substrate;
    a first conductive layer formed in the dielectric film and extending in a first direction, the first conductive layer being connected to a first select transistor;
    a second conductive layer formed in the dielectric film and extending in the first direction, the second conductive layer being connected to a second select transistor;
    a semiconductor layer connected to both the first and second conductive layers and functioning as a channel layer of a memory transistor;
    a gate-insulating film formed on the semiconductor layer, the gate-insulating film including a charge accumulation film as a portion thereof; and
    a third conductive layer surrounded by the gate-insulating film.

2. The non-volatile semiconductor memory device according to claim 1, wherein
    the gate-insulating film is an ONO film, and the ONO film comprises a first silicon oxide film, a silicon nitride film, and a second silicon oxide film, each film being formed in a closed loop surrounding the third conductive layer.

3. The non-volatile semiconductor memory device according to claim 1, wherein
    the third conductive layer comprises an insulating layer on the top surface thereof, the insulating layer having the same length as the third conductive layer, and the third conductive layer and the insulating layer are surrounded by the gate-insulating film.

4. The non-volatile semiconductor memory device according to claim 1, comprising trenches formed in the semiconductor substrate, wherein one of the trenches comprises a plurality of the first or second select transistors formed therein.

5. A non-volatile semiconductor memory device comprising:
    a plurality of memory sub-blocks, each memory sub-block comprising a plurality of memory transistors connected in parallel between a first node and a second node;
    a first select transistor having a first end connected to the first node;
    a second select transistor having a first end connected to the second node;
    a plurality of word-lines connected to respective gates of the memory transistors;
    a bit-line connected to a second end of the first select transistor; and
    a source-line connected to a second end of the second select transistor,
    the memory sub-block comprising:
    a semiconductor substrate;
    a dielectric film formed above the semiconductor substrate;
    a first conductive layer formed in the dielectric film and extending in a first direction perpendicular to the semiconductor substrate, the first conductive layer functioning as the first node;
    a second conductive layer formed in the dielectric film and extending in the first direction, the second conductive layer functioning as the second node;
    a semiconductor layer formed connecting the first conductive layer and the second conductive layer and extending in a second direction in parallel with the semiconductor substrate, the semiconductor layer functioning as a channel layer of the memory transistor; and
    a third conductive layer formed as opposed to the semiconductor layer via a gate-insulating film, the third conductive layer functioning as the gate electrode of the memory transistor,
    the gate-insulating film comprising a charge accumulation film as a portion thereof, the gate-insulating film being formed in a closed loop surrounding the third conductive layer in a cross-section in parallel with the first direction and the second direction.

6. The non-volatile semiconductor memory device according to claim 5, wherein
    the gate-insulating film is an ONO film, and the ONO film comprises a first silicon oxide film, a silicon nitride film, and a second silicon oxide film, each film being formed in a closed loop surrounding the third conductive layer.

7. The non-volatile semiconductor memory device according to claim 5, wherein
    the third conductive layer comprises an insulating layer on the top surface thereof, the insulating layer having the same length as the third conductive layer, and the third conductive layer and the insulating layer are surrounded by the gate-insulating film.

8. The non-volatile semiconductor memory device according to claim 5, wherein
    the first and second select transistors are formed on the semiconductor substrate, each of the first and second select transistors has a first end connected to the first conductive layer or the second conductive layer,
    each of the first and second select transistors comprises a trench formed in the semiconductor substrate and a gate-insulating film and a gate electrode embedded in the trench.

9. The non-volatile semiconductor memory device according to claim 5, comprising trenches formed in the semiconductor substrate, wherein one of the trenches comprises a plurality of the first or second select transistors formed therein.

10. The non-volatile semiconductor memory device according to claim 5, wherein
    the memory sub-blocks are arranged in a matrix in a third direction and in the second direction, the third direction being perpendicular to the first and second directions, the third conductive layer extends in the third direction as the longitudinal direction thereof, the third conductive layer is shared by a plurality of memory sub-blocks arranged in the third direction, and the third conductive layer functions as the word-line.

11. The non-volatile semiconductor memory device according to claim 5, wherein
the bit-line is formed extending in the second direction as the longitudinal direction thereof.

12. The non-volatile semiconductor memory device according to claim 5, further comprising,
a fourth conductive layer formed passing through the dielectric film and extending in a first direction perpendicular to the semiconductor substrate, the fourth conductive layer functioning as the third node, and
a fifth conductive layer formed passing through the dielectric film and extending in the first direction relative to the semiconductor substrate, the fifth conductive layer functioning as the fourth node, wherein
each of the first and second select transistors has a first end connected to the first conductive layer or the second conductive layer, and a second end connected to the fourth conductive layer or the fifth conductive layer.

13. The non-volatile semiconductor memory device according to claim 12, wherein
the first and second select transistors are formed on the semiconductor substrate, each of the first and second select transistors comprises a trench formed in the semiconductor substrate and a gate-insulating film and a gate electrode embedded in the trench.

14. The non-volatile semiconductor memory device according to claim 12, comprising trenches formed in the semiconductor substrate, wherein one of the trenches comprises a plurality of the first or second select transistors formed therein.

* * * * *